US010950756B2

(12) United States Patent
Hwang et al.

(10) Patent No.: US 10,950,756 B2
(45) Date of Patent: Mar. 16, 2021

(54) LIGHT EMITTING DEVICE INCLUDING A PASSIVATION LAYER ON A LIGHT EMITTING STRUCTURE

(71) Applicant: LG INNOTEK CO., LTD., Seoul (KR)

(72) Inventors: Sung Min Hwang, Seoul (KR); Sun Woo Park, Seoul (KR); Chang Hyeong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/466,993

(22) PCT Filed: Dec. 6, 2017

(86) PCT No.: PCT/KR2017/014261
§ 371 (c)(1),
(2) Date: Jun. 5, 2019

(87) PCT Pub. No.: WO2018/106030
PCT Pub. Date: Jun. 14, 2018

(65) Prior Publication Data
US 2019/0386180 A1    Dec. 19, 2019

(30) Foreign Application Priority Data
Dec. 6, 2016 (KR) ........................ 10-2016-0164908

(51) Int. Cl.
*H01L 33/40* (2010.01)
*F21K 9/00* (2016.01)
(Continued)

(52) U.S. Cl.
CPC .............. *H01L 33/405* (2013.01); *F21K 9/00* (2013.01); *H01L 33/10* (2013.01); *H01L 33/30* (2013.01);
(Continued)

(58) Field of Classification Search
CPC .......... H01L 33/08; H01L 33/10; H01L 33/44; H01L 33/46; H01L 33/60; H01L 33/387; H01L 33/405; F21K 9/00
See application file for complete search history.

(56) References Cited

U.S. PATENT DOCUMENTS 8,716,743 B2 * 5/2014 Yu ........................... H01L 31/18
257/99
9,548,424 B2 * 1/2017 Hsieh .................... H01L 33/405
(Continued)

FOREIGN PATENT DOCUMENTS

JP    2009-188422 A    8/2009
JP    2009-194367 A    8/2009
(Continued)

*Primary Examiner* — Khiem D Nguyen
(74) *Attorney, Agent, or Firm* — Birch, Stewart, Kolasch & Birch, LLP

(57) ABSTRACT

The embodiments of the present invention relate to a light emitting device, a method for manufacturing a light emitting device, a light emitting device package, and a lighting device. A light emitting device according to an embodiment has: a light emitting structure including a first conductivity type semiconductor layer, a second conductivity type semiconductor layer, and an active layer disposed between the first conductivity type semiconductor layer and the second conductivity type semiconductor layer; a passivation layer disposed on the light emitting structure; and an insulating reflective layer disposed on the passivation layer. The passivation layer may include a first region disposed on an upper surface of the light emitting structure, and a second region disposed on side surfaces of the first conductivity type semiconductor layer, the second conductivity type semiconductor layer, and the active layer. The insulating reflective layer may be disposed on the first region, and an end portion of the insulating reflective layer may be disposed apart from an end portion of the first region.

19 Claims, 12 Drawing Sheets

(51) Int. Cl.
  *H01L 33/10* (2010.01)
  *H01L 33/30* (2010.01)
  *H01L 33/38* (2010.01)
  *H01L 33/42* (2010.01)
  *H01L 33/46* (2010.01)
  *H01L 33/62* (2010.01)

(52) U.S. Cl.
  CPC ............ *H01L 33/387* (2013.01); *H01L 33/42* (2013.01); *H01L 33/46* (2013.01); *H01L 33/62* (2013.01)

(56) References Cited

U.S. PATENT DOCUMENTS

| | | | |
|---|---|---|---|
| 9,705,039 B2 * | 7/2017 | Obata | H01L 33/38 |
| 9,705,041 B2 * | 7/2017 | Im | H01L 33/382 |
| 2012/0007121 A1 * | 1/2012 | Lee | H01L 33/382 257/98 |
| 2012/0208330 A1 * | 8/2012 | Jeong | H01L 29/4908 438/158 |
| 2016/0043280 A1 | 2/2016 | Moon et al. | |
| 2017/0125641 A1 * | 5/2017 | Jeon | H01L 33/32 |
| 2018/0301598 A1 * | 10/2018 | Baur | H01L 33/44 |

FOREIGN PATENT DOCUMENTS

| | | | | |
|---|---|---|---|---|
| JP | 2011-100975 A | | 5/2011 | |
| KR | 10-2011-0101464 | * | 9/2011 | ............ H01L 33/10 |
| KR | 10-2011-0101464 A | | 9/2011 | |
| KR | 10-2012-0078382 A | | 7/2012 | |
| KR | 10-2016-0017905 A | | 2/2016 | |
| KR | 10-1609763 B1 | | 4/2016 | |

* cited by examiner

【Figure 1a】
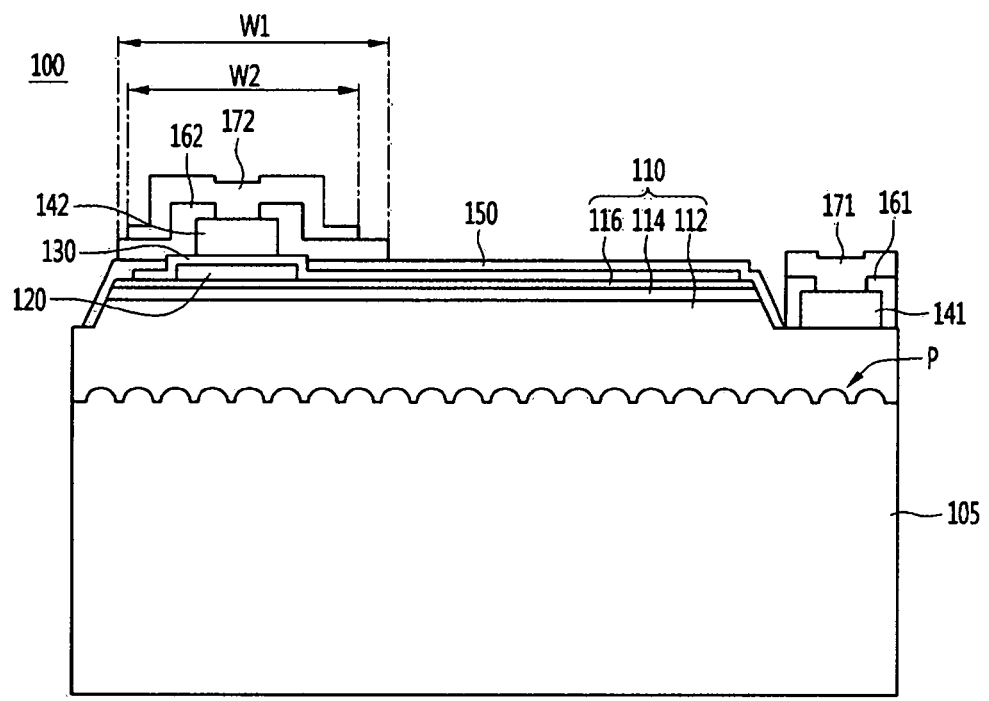

[Figure 1b]
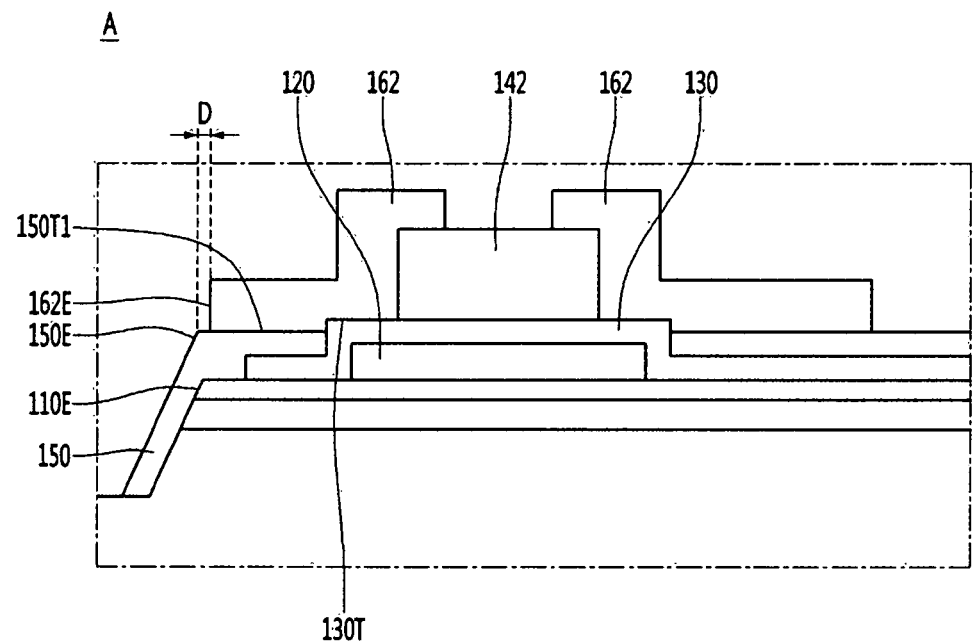
[Figure 1c]
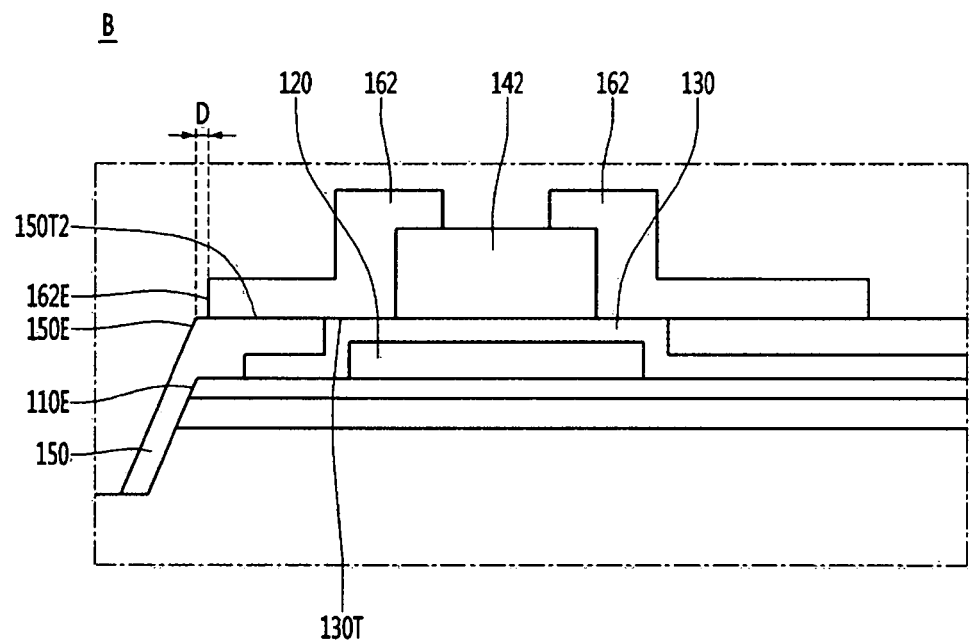

【Figure 2】
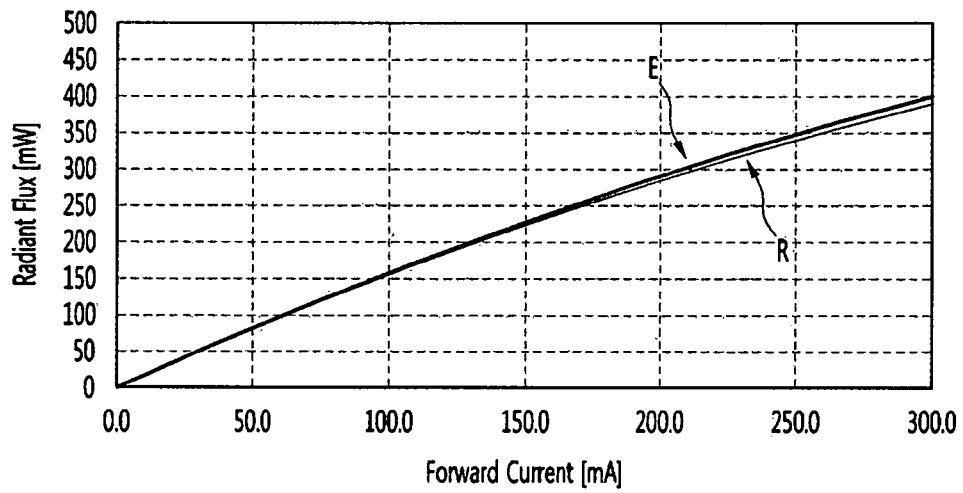
【Figure 3】
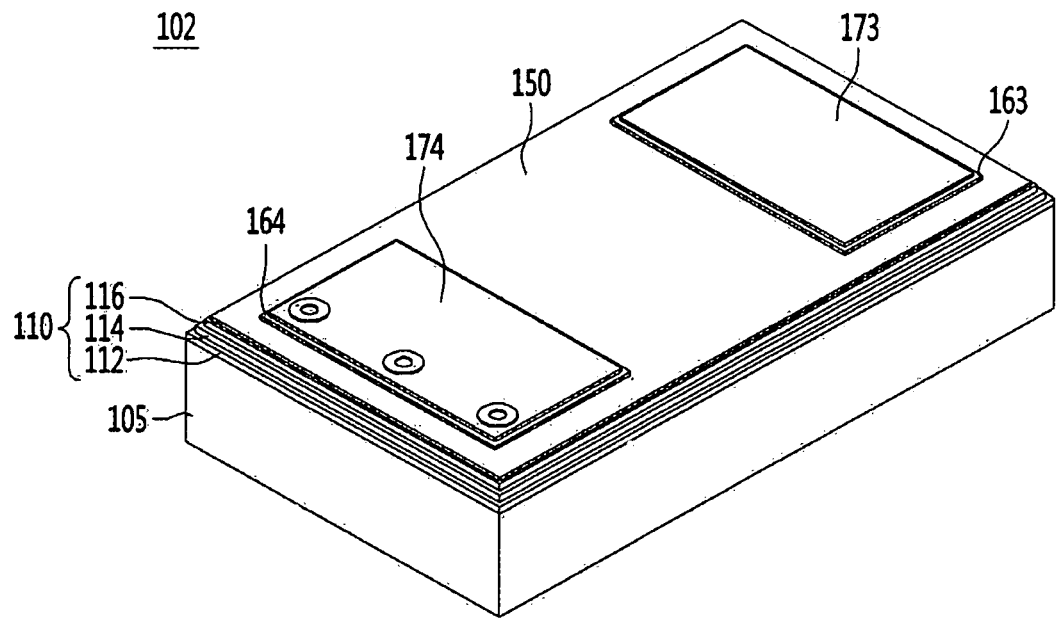

[Figure 4]
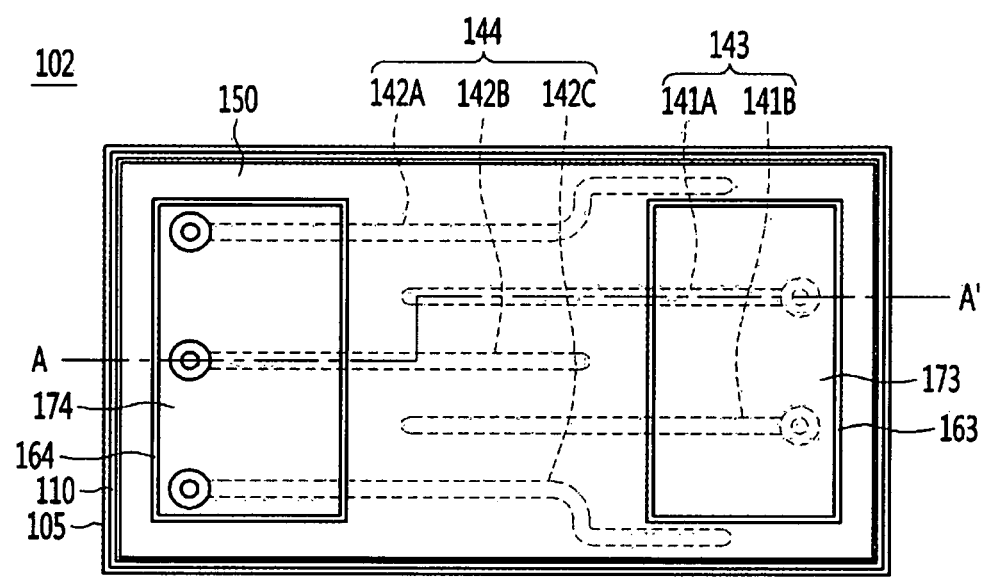

[Figure 5]
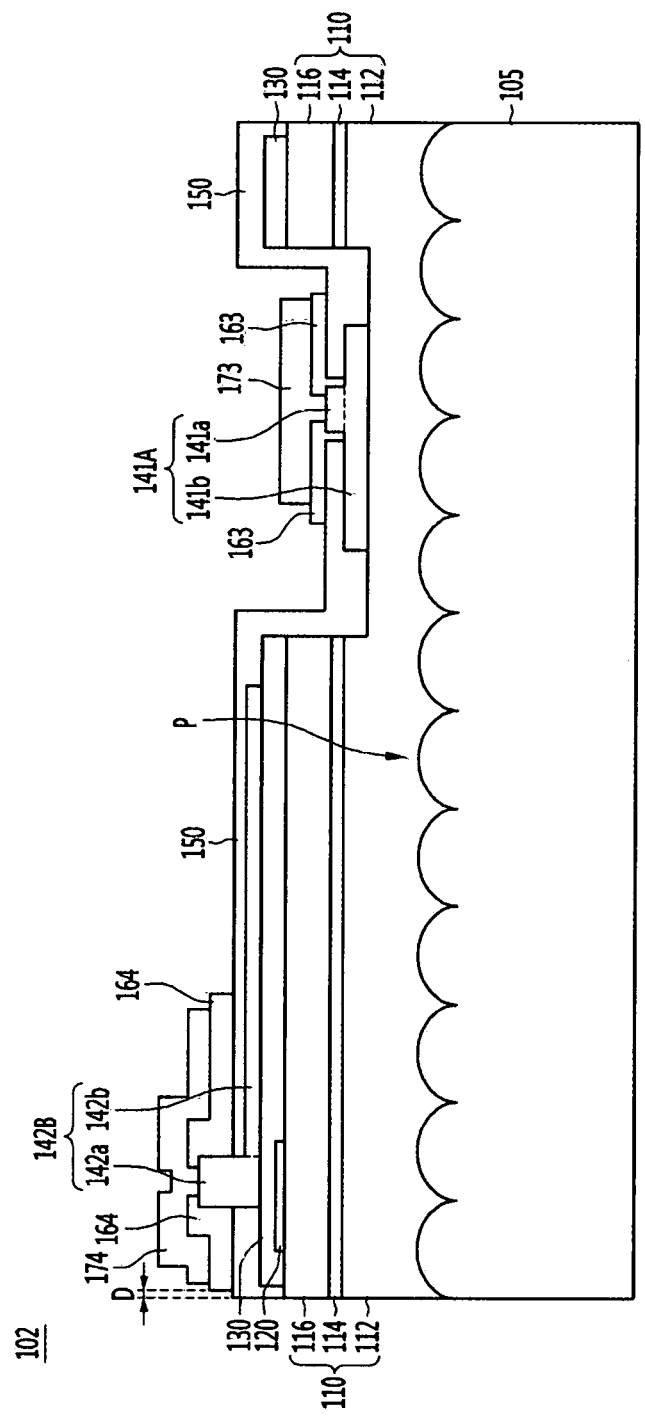

[Figure 6]
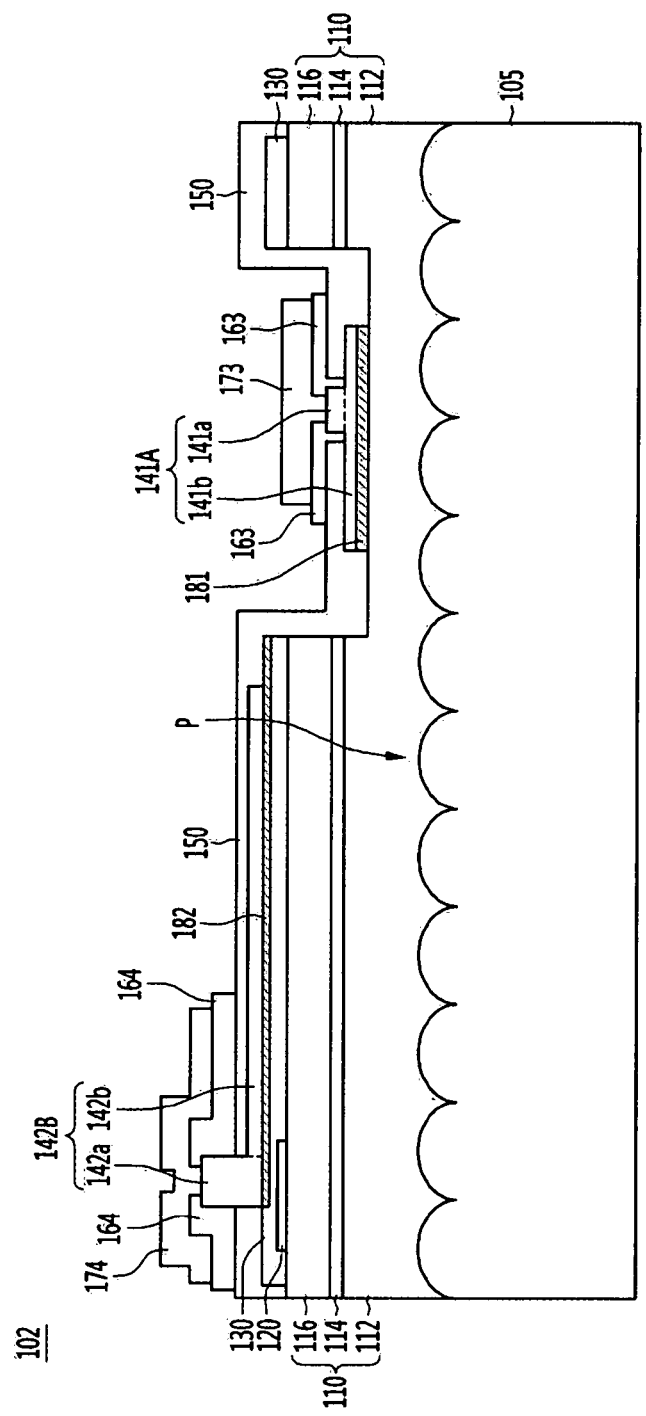

[Figure 7]
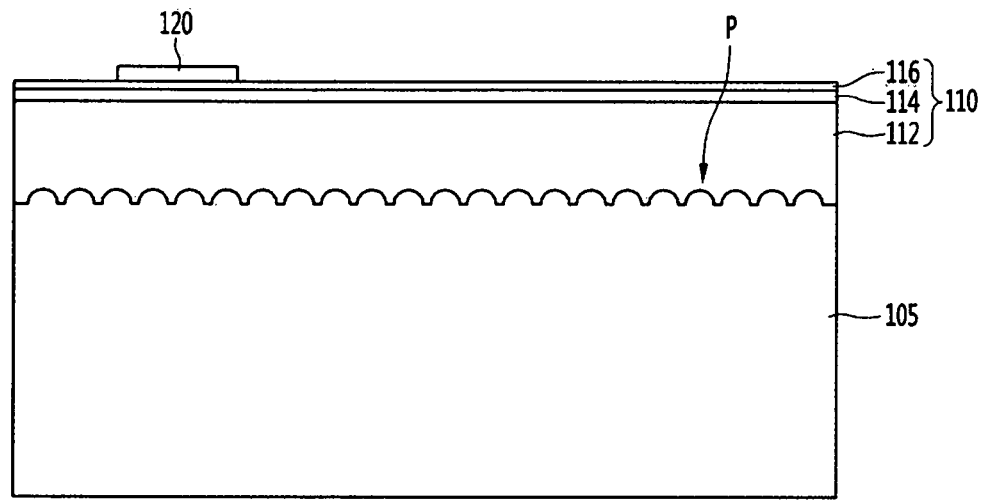
[Figure 8]
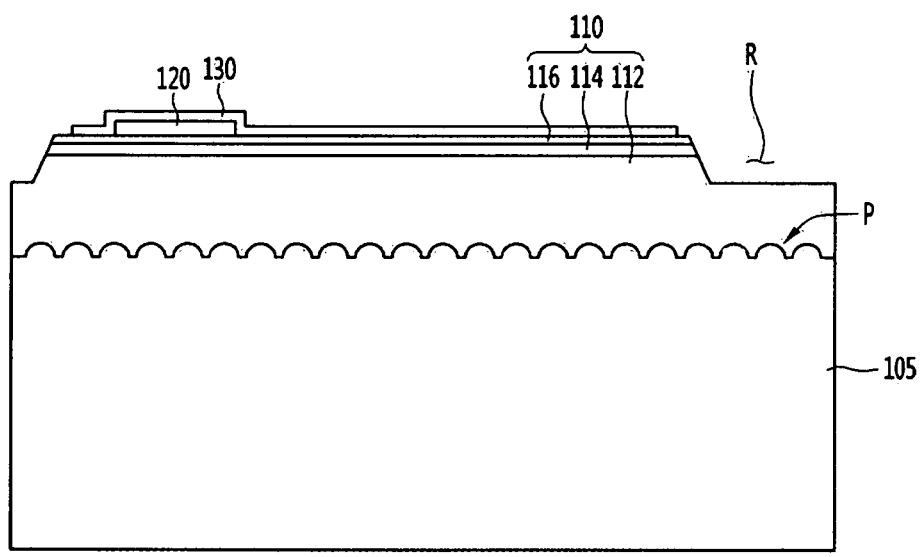

[Figure 9]
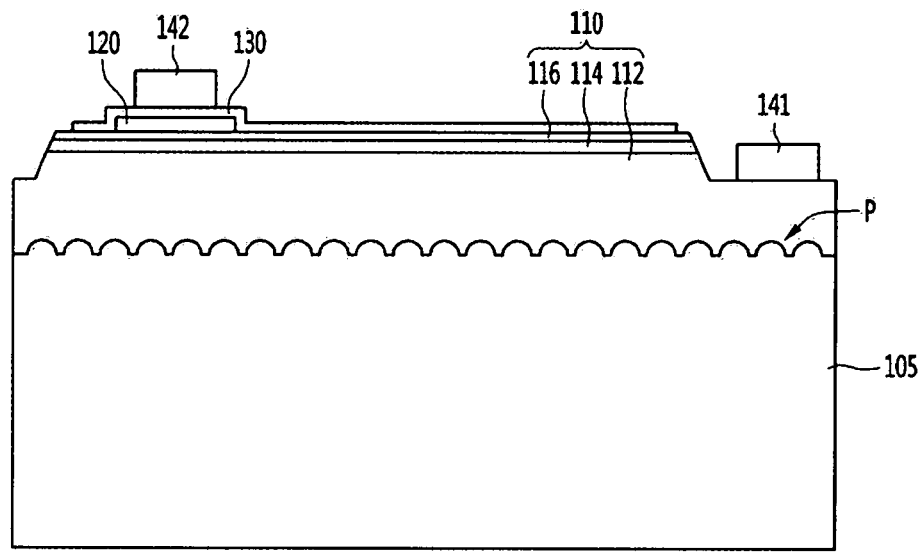
[Figure 10]
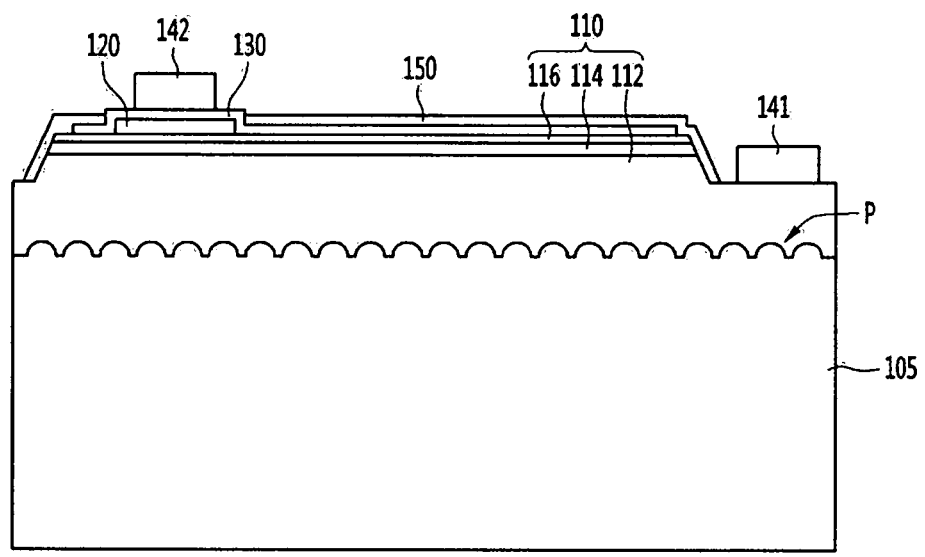

[Figure 11a]
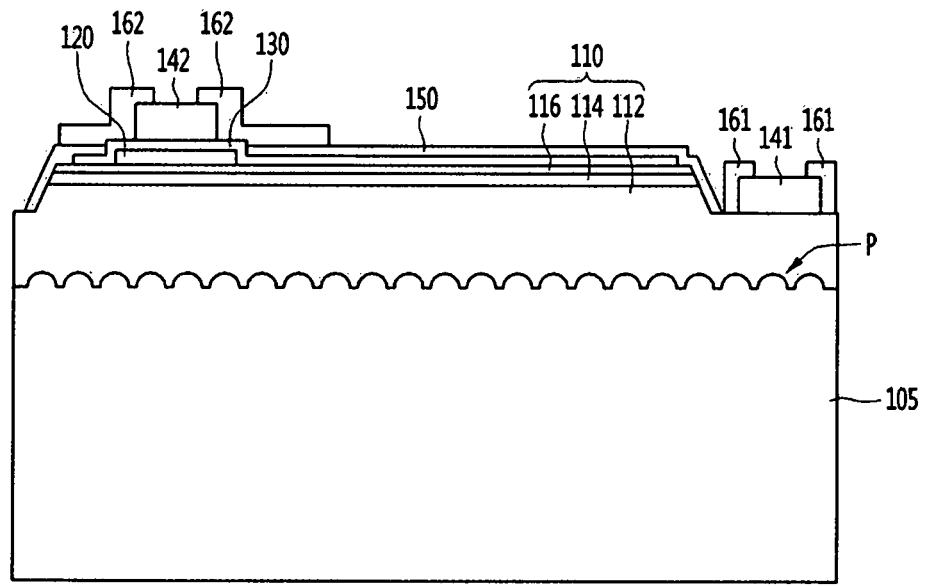
[Figure 11b]
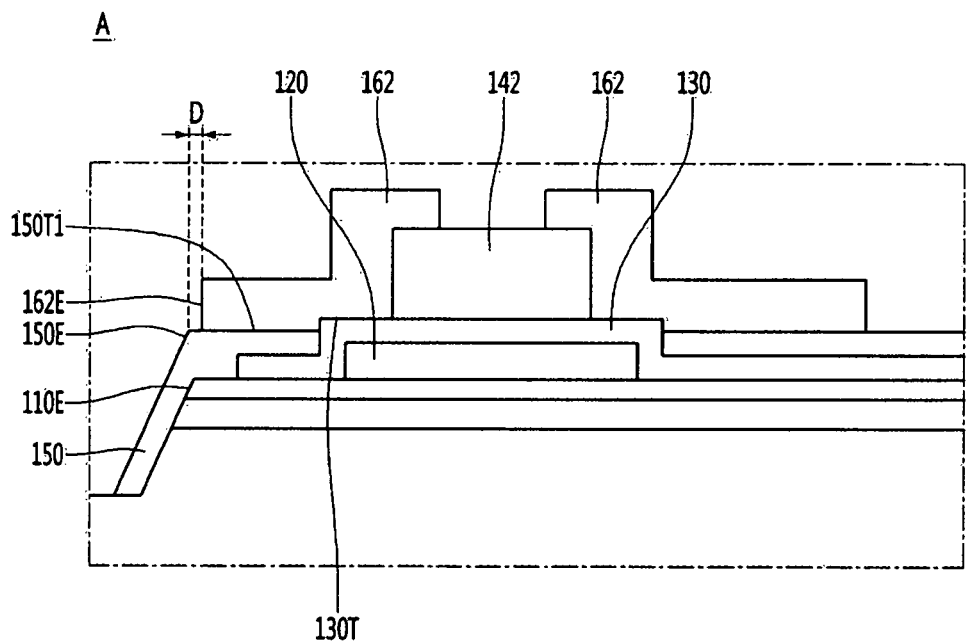

[Figure 11c]
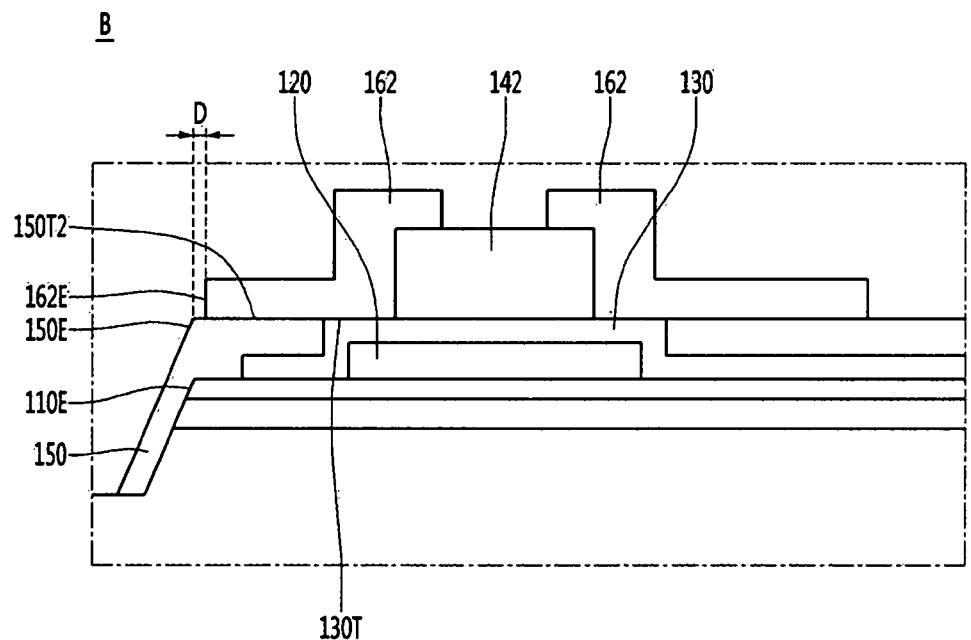
[Figure 12]
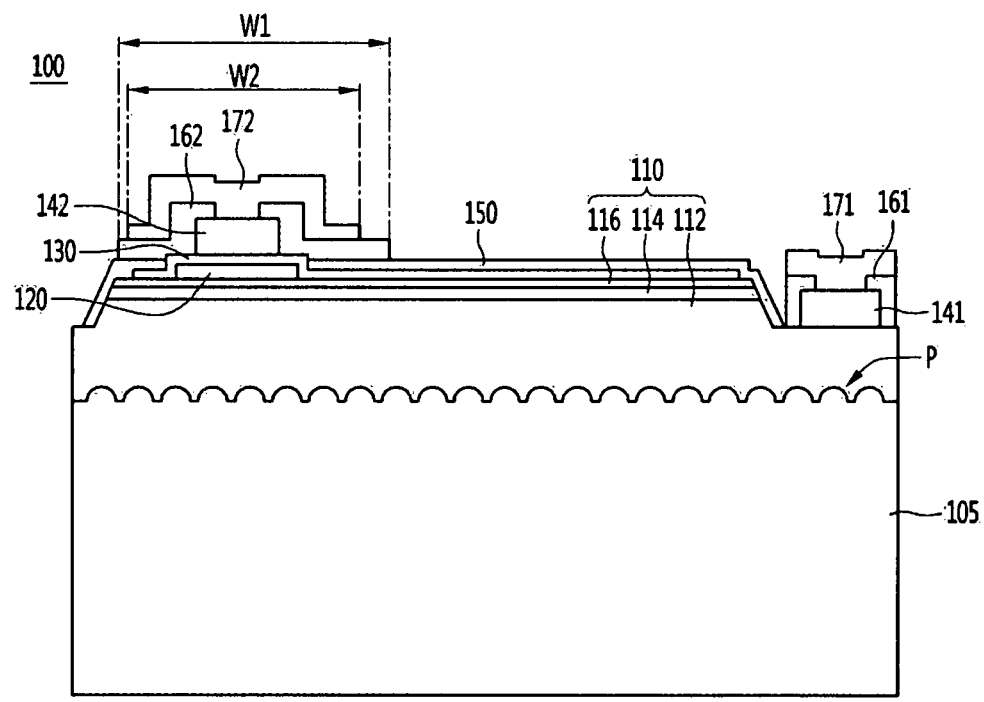

[Figure 13]
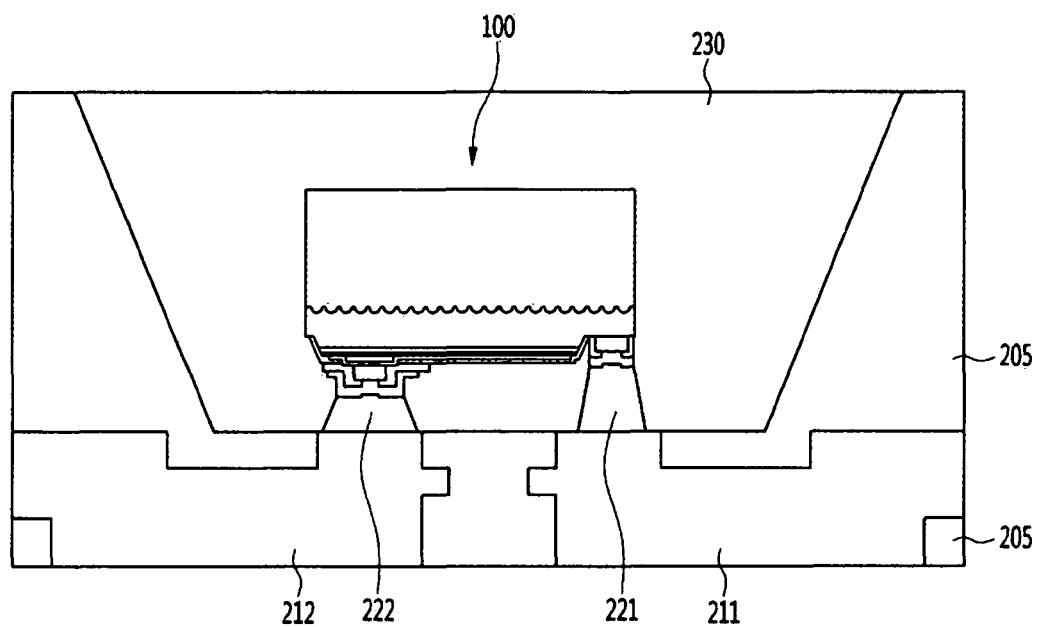

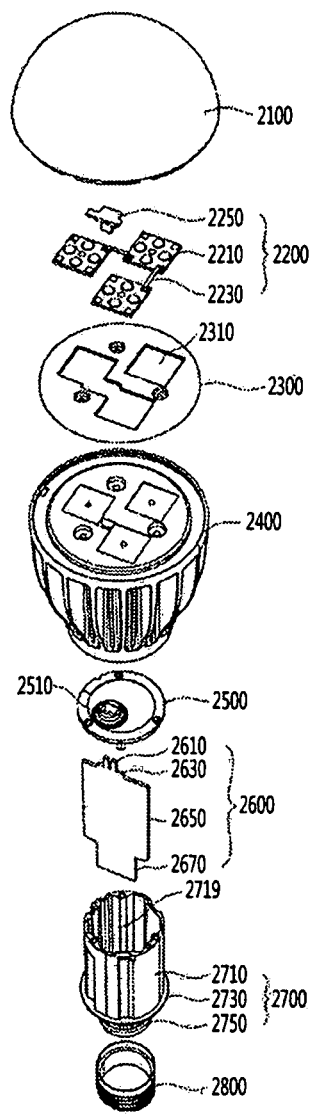
[Figure 14]

LIGHT EMITTING DEVICE INCLUDING A PASSIVATION LAYER ON A LIGHT EMITTING STRUCTURE

CROSS REFERENCE TO RELATED APPLICATIONS

This application is the National Phase of PCT International Application No. PCT/KR2017/014261, filed on Dec. 6, 2017, which claims priority under 35 U.S.C. 119(a) to Patent Application No. 10-2016-0164908, filed in the Republic of Korea on Dec. 6, 2016, all of which are hereby expressly incorporated by reference into the present application.

TECHNICAL FIELD

Embodiments relate to a light emitting device, a light emitting device package, and a lighting device including the same.

BACKGROUND ART

Semiconductor devices including compounds such as GaN and AlGaN have many merits such as wide and easy bandgap energy, and can be used variously as light emitting devices, light receiving devices, and various diodes.

Particularly, a light emitting device such as a light emitting diode or a laser diode using a semiconductor material of Group III-V or II-VI group semiconductors can be applied to various devices such as a Red, Blue, and ultraviolet rays. By using fluorescent materials or combining colors, it is possible to implement a white light beam with high efficiency. Also, compared to conventional light sources such as fluorescent lamps and incandescent lamps, it has many merits such as low power consumption, Speed, safety, and environmental friendliness.

In addition, when a light-receiving element such as a photodetector or a solar cell is manufactured using a semiconductor material of Group III-V or Group II-VI compound semiconductor, development of a device material absorbs light of various wavelength regions to generate a photocurrent, it is possible to use light in various wavelength ranges from the gamma ray to the radio wave region.

It also has advantages of fast response speed, safety, environmental friendliness and easy control of device materials, so it can be easily used for power control or microwave circuit or communication module.

Therefore, applications are extended to a transmission module of the optical communication means, a light emitting diode backlight replacing a cold cathode fluorescent lamp (CCFL) constituting a backlight of an LCD (Liquid Crystal Display) display device, a white Light emitting device capable of replacing a fluorescent lamp or an incandescent lamp Diode lighting devices, automotive headlights, traffic lights, and gas and fire sensors. Further, applications can be extended to high frequency application circuits, other power control devices, and communication modules.

The light emitting device may be formed by combining a group III-V element or a group II-VI element in the periodic table with a pn junction diode in which electric energy is converted into light energy, so that various colors can be implemented.

For example, nitride semiconductors have received great interest in the development of optical devices and high power electronic devices due to their high thermal stability and wide bandgap energy.

Particularly, a blue Light emitting device, a green Light emitting device, an ultraviolet (UV) Light emitting device, and a red (RED) Light emitting device using a nitride semiconductor are commercially available and widely used.

For example, in the case of an ultraviolet light emitting diode (UV LED), a light emitting diode that emits light distributed in a wavelength range of 200 nm to 400 nm is used for sterilization and purification in short wavelength of the above wavelength range, or is used for a Stepper or a hardener in long wavelength of the above wavelength range.

On the other hand, according to the related art, the light emitting device chip is mounted on a predetermined package body by using solder paste, and there is a problem that the light intensity Po is lowered by such a solder paste.

For example, according to the related art, a light emitting device chip is mounted using a SAC (Sn—Ag—Cu) paste, and the light intensity is lowered due to light absorption in the SAC (Sn—Ag—Cu) paste.

Further, according to the related art, when the light emitting device chip is mounted on a predetermined package body using solder paste, it cannot be ensured that the light emitting device chip is sufficiently wide due to the light absorption problem of the solder paste or the like, a sufficient contact area cannot be ensured and electric reliability is deteriorated.

In addition, according to the related art, branch electrodes are used for current diffusion. Such branched electrodes absorb light emitted from the light emitting layer, resulting in deterioration of light efficiency.

DISCLOSURE

Technical Problem

Embodiments are to provide a light emitting device, a light emitting device package, and a lighting device including the light emitting device, which can improve the light intensity Po by minimizing light absorption by the paste.

Embodiments are to provide a light emitting device, a light emitting device package, and a lighting device including the same, which can solve the problem that the electrical contact area between the electrodes of the package body and the bump or the like cannot be sufficiently secured.

In addition, embodiments are to provide a light emitting device, a light emitting device package, and a lighting device including the same that can improve light efficiency by minimizing light absorption by the branched electrodes.

Technical Solution

A light emitting device according to an embodiment may include a light emitting structure including a first conductivity type semiconductor layer, a second conductivity type semiconductor layer, and an active layer disposed between the first conductivity type semiconductor layer and the second conductivity type semiconductor layer; a passivation layer disposed on the light emitting structure; and an insulating reflective layer disposed on the passivation layer.

The passivation layer may include a first region disposed on an upper surface of the light emitting structure, and a second region disposed on a side surface of the first conductivity type semiconductor layer, the second conductivity type semiconductor layer, and the active layer.

The insulating reflective layer may be disposed on the first region, and an end portion of the insulating reflective layer may be disposed apart from an end portion of the first region.

The embodiment may further include a light-transmitting electrode between the passivation layer and the light-emitting structure.

In an embodiment, the upper surface of the transparent electrode layer may be disposed higher than the first region of the passivation layer.

In an embodiment, the upper surface of the transparent electrode layer may be disposed at the same height as the first region of the passivation layer.

In an embodiment, the passivation layer has a predetermined first through-hole, and the transparent electrode may be exposed by the first through-hole.

The embodiment may further include a second electrode disposed on the second conductivity type semiconductor layer, wherein the exposed light-transmitting electrode is disposed between the second conductivity type semiconductor layer and the second electrode, and can be electrically connected.

The embodiment may include a second wetting layer disposed on the second electrode, and the insulating reflective layer may have a second through hole on the upper surface of the second electrode.

In an embodiment, the second wetting layer may be electrically connected to the second electrode through a second through hole of the second insulating reflective layer.

In an embodiment, the upper surface of the second wetting layer may be provided with recesses.

The embodiment further includes a first electrode disposed on the first conductivity type semiconductor layer, Wherein the insulating reflective layer comprises: a first insulating reflective layer disposed on the first electrode; and a second insulating reflective layer disposed on the second electrode.

In an embodiment, the passivation layer may be in contact with the first insulating reflective layer and the second insulating reflective layer.

In an embodiment, the end of the insulating reflective layer may be spaced inwardly from an end of the upper surface of the light emitting structure.

A light emitting device according to an embodiment includes a light emitting structure including a first conductivity type semiconductor layer, an active layer disposed on the first conductivity type semiconductor layer, and a second conductivity type semiconductor layer disposed on the active layer. A substrate disposed below the first conductivity type semiconductor layer; a first electrode disposed on the first conductivity type semiconductor layer exposed by removing a portion of the second conductivity type semiconductor layer and the active layer; a second electrode disposed on the second conductivity type semiconductor layer; a passivation layer disposed on a side surface and a part of an upper surface of the light emitting structure; a first insulating reflective layer disposed on a side surface and a part of an upper surface of the first electrode so as to expose an upper surface of the first electrode; a second insulating reflective layer disposed on a portion of a side surface and an upper surface of the second electrode and on a part of the passivation layer to expose an upper surface of the second electrode; a first wetting layer disposed on the first insulating reflective layer and the first electrode; and a second wetting layer disposed on the second insulating reflective layer and the second electrode.

And one end of the second insulating reflective layer may be disposed at a predetermined distance inwardly from the upper end of the passivation layer.

And a transparent electrode disposed on the light emitting structure. The upper surface of the transparent electrode layer may be disposed higher than the first upper surface of the passivation layer.

And a transparent electrode disposed on the light emitting structure. The upper surface of the transparent electrode layer may be disposed at the same height as the second upper surface of the passivation layer.

The light emitting device according to the embodiment includes a first conductivity type semiconductor layer 112, an active layer 114 disposed on the first conductivity type semiconductor layer 112, a second conductivity type semiconductor layer 112 disposed on the active layer 114, a light emitting structure 110 comprising a layer 116; a substrate 105 disposed under the first conductivity type semiconductor layer 112; a first electrode 141 disposed on the first conductivity type semiconductor layer 112 exposed by removing a portion of the second conductivity type semiconductor layer 116 and the active layer 114; a second electrode 142 disposed on the second conductivity type semiconductor layer 116; a first insulating reflective layer 161 disposed on a side surface and a part of an upper surface of the first electrode 141 so as to expose an upper surface of the first electrode 141; a second insulating reflective layer (162) disposed on a side surface and a part of an upper surface of the second electrode (142) so as to expose an upper surface of the second electrode (142); a first wetting layer 171 disposed on the first insulating reflective layer 161 and the first electrode 141; and a second wetting layer 172 disposed on the second insulating reflective layer 162 and the second electrode 142.

The horizontal width of the second wetting layer may be greater than the horizontal width of the second electrode.

One end of the second insulating reflective layer may be exposed to the side of the second wetting layer.

The light emitting device according to the embodiment includes a first conductivity type semiconductor layer 112, an active layer 114 disposed on the first conductivity type semiconductor layer 112, a second conductivity type semiconductor layer 112 disposed on the active layer 114, a light emitting structure 110 including a semiconductor layer 116; a substrate 105 disposed under the first conductivity type semiconductor layer 112; a plurality of third electrodes 143 disposed on the first conductivity type semiconductor layer 112 exposed by removing a portion of the second conductivity type semiconductor layer 116 and the active layer 114; a plurality of fourth electrodes 144 disposed on the second conductivity type semiconductor layer 116; a third insulating reflective layer (163) disposed on a side surface and a part of an upper surface of the plurality of third electrodes (143) so as to expose an upper surface of the plurality of third electrodes (143); a fourth insulating reflective layer 164 disposed on a side surface and a part of an upper surface of the plurality of fourth electrodes 144 to expose an upper surface of the plurality of fourth electrodes 144; a third wetting layer 173 disposed on the third insulating reflective layer 163 and the plurality of third electrodes 143; and a fourth wetting layer 174 disposed on the fourth insulating reflective layer 164 and the plurality of fourth electrodes 144.

In an embodiment, one end of the fourth insulating reflective layer may be disposed at a predetermined distance inward from the outer surface of the light emitting structure.

The fourth insulating reflective layer may include a passivation layer disposed on a side surface and an upper surface of the light emitting structure, wherein a part of the fourth insulating reflective layer is disposed on the passivation layer, and can be disposed at a predetermined distance from the inner side.

The horizontal width of the fourth wetting layer may be greater than the horizontal width of the fourth electrode.

One end of the fourth insulating reflective layer may be exposed to the side of the fourth wetting layer.

The light emitting device package according to the embodiment may include the light emitting device.

The lighting apparatus according to the embodiment may include a light emitting unit having the Light emitting device.

Advantageous Effects

Embodiments can provide a light emitting device, a light emitting device package, and a lighting device including the light emitting device, which can improve the light intensity Po by minimizing light absorption by the paste.

Embodiments can provide a light emitting device, a light emitting device package, and a lighting device including the same, which can solve the problem that the electrical contact area between the electrode of the package body and the bump or the like cannot be sufficiently secured.

Also, the embodiment can provide a light emitting device, a light emitting device package, and a lighting device including the same, which can improve light efficiency by minimizing light absorption by the branched electrodes.

DESCRIPTION OF DRAWINGS

FIG. 1a is a sectional view of a light emitting device according to a first embodiment;

FIG. 1b is a partially enlarged view of a light emitting device according to the first embodiment;

FIG. 1c is another enlarged view of the light emitting device according to the first embodiment.

FIG. 2 is a view showing luminous flux data of the light emitting device package according to the comparative example and the example.

FIG. 3 is a perspective view of a light emitting device according to a second embodiment;

FIG. 4 is a planar projected figure of the package of the light emitting device according to the second embodiment.

FIG. 5 is a sectional view of a package of the light emitting device according to the second embodiment;

FIG. 6 is a sectional view of a package of the light emitting device according to the third embodiment.

FIGS. 7 to 12 are cross-sectional views illustrating a manufacturing process of a light emitting device according to an embodiment.

FIG. 13 is a cross-sectional view of a package of a light emitting device according to an embodiment.

FIG. 14 is a perspective view of a lighting apparatus according to an embodiment.

MODE FOR INVENTION

Hereinafter, embodiments that can be specifically implemented for solving the above problems will be described with reference to the accompanying drawings.

In describing an embodiment, when it is described as being formed "on or under" of each element, an upper or lower (on or under) wherein both elements are in direct contact with each other or one or more other elements are indirectly formed between the two elements.

Also, when expressed as "on or under", it may include not only an upward direction but also a downward direction with respect to one element.

The semiconductor device may include various electronic devices such as a light emitting device and a light receiving device. The light emitting device and the light receiving device may include the first conductivity type semiconductor layer, the active layer, and the second conductivity type semiconductor layer.

The semiconductor device according to this embodiment may be a light emitting device.

The light emitting device emits light by recombination of electrons and holes, and the wavelength of the light is determined by the energy band gap inherent to the material.

Thus, the emitted light may vary depending on the composition of the material.

First Embodiment

FIG. 1a is a cross-sectional view of a light emitting device 100 according to the first embodiment.

The light emitting device 100 according to the embodiment may include at least one of the light emitting structure 110, the substrate 105, the first electrode 141, the second electrode 142, the first insulating reflective layer 161, the second insulating reflective layer 162, a first wetting layer 171, and a second wetting layer 172.

The light emitting structure 110 may include a first conductivity type semiconductor layer 112, an active layer 114 on the first conductivity type semiconductor layer 112, and a second conductivity type semiconductor layer 116 on the active layer 114.

For example, the light emitting device 100 according to the embodiment may include a light emitting structure 110 including a first conductivity type semiconductor layer 112, an active layer 114 disposed on the first conductivity type semiconductor layer 112, a second conductivity type semiconductor layer 116 disposed on the active layer 114 conductivity type semiconductor layer; and a substrate 105 disposed below the first conductivity type semiconductor layer 112; a first electrode 141 disposed on the first conductivity type semiconductor layer 112 exposed by removing a part of the active layer 114 and a portion of the second conductivity type semiconductor layer 116; a second electrode 142 disposed on the second conductivity type semiconductor layer 116; a first insulating reflective layer 161 disposed on a side surface and a part of an upper surface of the first electrode 141 so as to expose an upper surface of the first electrode 141; a second insulating reflective layer 162 disposed on a side surface and a part of an upper surface of the electrode 142 so as to expose an upper surface of the second electrode 142; a first wetting layer 171 disposed on the electrode 141 and first insulating reflective layer 161; and a second wetting layer 172 disposed on the second insulating reflective layer 162 and the second electrode 142.

Hereinafter, technical features of the light emitting device 100 according to the embodiment will be described with reference to FIGS. 1a and 1b.

<Substrate>

The substrate 105 may be formed of a material having excellent thermal conductivity or a material having excellent light transparency to improve thermal reliability and improve light extraction efficiency.

For example, the substrate 105 may be a conductive substrate or an insulating substrate.

For example, at least one of GaAs, sapphire ($Al_2O_3$), SiC, Si, GaN, ZnO, GaP, InP, Ge and $Ga_2O_3$ may be used as the substrate 105.

A predetermined light extraction pattern P, for example, PSS, may be formed on the upper surface of the substrate 105 to improve light extraction efficiency.

In addition, in the embodiment, the substrate 105 may have a concavo-convex structure through lower patterning to improve the light extraction efficiency.

For example, the light extraction may be improved by wet etching or the like at about 300° C. by using $H_3Po_4$ or the like on the lower surface of the substrate 105 to form a conical pattern (not shown), but it is not limited thereto.

In an embodiment, a buffer layer (not shown) may be formed on the substrate 105.

The buffer layer can relieve lattice mismatching between the light emitting structure 110 and the substrate 105 to be formed later.

The buffer layer may be formed of at least one of Group III-V compound semiconductor such as GaN, InN, AlN, InGaN, AlGaN, InAlGaN, and AlInN.

An undoped semiconductor layer (not shown) may be formed on the buffer layer, but the present invention is not limited thereto.

<Light Emitting Structure>

The light emitting structure 110 may include a first conductivity type semiconductor layer 112, an active layer 114, and a second conductivity type semiconductor layer 116.

The first conductivity type semiconductor layer 112 may be formed of a compound semiconductor such as a Group III-V or II-VI, or the like, and may be doped with a first conductive dopant.

For example, when the first conductivity type semiconductor layer 112 is an n-type semiconductor layer, the n-type dopant may include Si, Ge, Sn, Se, and Te, but it is not limited thereto.

The first conductivity type semiconductor layer 112 may include a semiconductor material having a composition formula of $In_xAl_yGa_{1-x-y}N$ (0≤x≤1, 0≤y≤1, 0≤x+y≤1).

For example, the first conductivity type semiconductor layer 112 may be formed of one or more of GaN, InN, AlN, InGaN, AlGaN, InAlGaN, AlInN, AlGaAs, InGaAs, AlInGaAs, GaP, AlGaP, InGaP, AlInGaP.

Next, in the embodiment, the active layer 114 is formed such that the electrons injected through the first conductivity type semiconductor layer 112 and the holes injected through the second conductivity type semiconductor layer 116 formed thereafter mutually meet to form an active layer (light emitting layer), the active layer 114 emits light with energy determined by the material's inherent energy band.

The active layer 114 may be formed of at least one of a single quantum well structure, a multi quantum well (MQW) structure, a quantum-wire structure, or a quantum dot structure.

The active layer 114 may include a quantum well (not shown)/a quantum wall (not shown) structure.

For example, the active layer 114 may be formed of any one or more pairs of InGaN/GaN, InGaN/InGaN, GaN/AlGaN, InAlGaN/GaN, GaAs/AlGaAs, InGaP/AlGaP, GaP/AlGaP, but it is not limited thereto.

Next, in the embodiment, an electron blocking layer (not shown) is formed on the active layer 114 to serve as electron blocking and cladding of the active layer 114, thereby improving the luminous efficiency.

For example, the electron blocking layer may be formed of $Al_xIn_yGa_{(1-x-y)}N$ (0≤x≤1, 0≤y≤1) based semiconductor and may have a higher energy band than the energy band gap of the active layer 114.

In the embodiment, the electron blocking layer can effectively block the electrons that are ion-implanted into the p-type and overflow, and increase the hole injection efficiency.

Next, in the embodiment, the second conductivity type semiconductor layer 116 may be formed of a semiconductor compound.

For example, the second conductivity type semiconductor layer 116 may be formed of a compound semiconductor such as a Group III-V, a Group II-VI, or the like, and may be doped with a second conductive dopant.

The second conductivity type semiconductor layer 116 may be a Group III-V compound semiconductor doped with a second conductive dopant, such as $In_xAl_yGa_{1-x-y}N$ (0≤x≤1, 0≤y≤1, 0≤x+y≤1).

When the second conductivity type semiconductor layer 116 is a p-type semiconductor layer, the second conductive dopant may include Mg, Zn, Ca, Sr, and Ba as p-type dopants.

In the light emitting structure 110 of the embodiment, the first conductivity type semiconductor layer 112 may be an n-type semiconductor layer, and the second conductivity type semiconductor layer 116 may be a p-type semiconductor layer, but it is not limited thereto.

Also, on the second conductivity type semiconductor layer 116, a semiconductor (e.g., an n-type semiconductor) (not shown) having a polarity opposite to that of the second conductivity type semiconductor may be formed.

Accordingly, the light emitting structure 110 may have any one of an n-p junction structure, a p-n junction structure, an n-p-n junction structure, and a p-n-p junction structure.

<Transparent Electrode, First and Second Electrodes>

Embodiments may include the light-transmitting electrode 130 on the light-emitting structure 110.

In the embodiment, the light-transmitting electrode 130 may be formed on the second conductivity type semiconductor layer 116 to improve the current diffusion to increase the light output and improve the light extraction efficiency.

In an embodiment, the transparent electrode layer 130 may be formed of a good material in electrical contact with a semiconductor.

For example, the light transmitting electrode layer 130 may be formed of indium tin oxide (ITO), indium zinc oxide (IZO), indium zinc oxide (IZTO), indium aluminum zinc oxide (IAZO), indium gallium zinc oxide (ZnO), indium gallium tin oxide (AZO), aluminum zinc oxide (AZO), antimony tin oxide (ATO), gallium zinc oxide (GZO), IZON nitride, AGZO Or a multi-layer structure including at least one of them.

In addition, the current diffusion layer 120 may be formed at a position corresponding to the second electrode 142 to be formed later for current diffusion.

The current diffusion layer 120 may be formed on the second conductivity type semiconductor layer 116, and the light transmitting electrode layer 130 may be formed thereafter.

The current diffusion layer 120 may be formed of an oxide or a nitride, but it is not limited thereto.

The current diffusion layer 120 is formed to have a horizontal width equal to or larger than the horizontal width of the second electrode 142 to be formed later, thereby preventing the current concentration at the lower side of the second electrode 142, thereby improving the electrical reliability.

Next, the embodiment may include a first electrode 141 and a second electrode 142 electrically connected to the light emitting structure 110.

For example, the embodiment may include a first electrode 141 disposed on a top surface of a first conductivity type semiconductor layer 112 exposed by removing a part of the second conductivity type semiconductor layer 116 and a part of the active layer 114, and a second electrode 142 disposed on the second conductivity type semiconductor layer 116.

The second electrode 142 may be disposed on the transparent electrode layer 130 at a position overlapping with the current diffusion layer 120.

The first electrode 141 and the second electrode 142 may have a single-layer structure or a multi-layer structure.

For example, the first electrode 141 and the second electrode 142 may be ohmic electrodes.

For example, the first electrode 141 and the second electrode 142 may be formed of one selected from the group consisting of ZnO, IrOx, RuOx, NiO, RuOx/ITO, Ni/IrOx/Au, At least one of Cr, Ti, Al, Rh, Pd, Ir, Ru, Mg, Zn, Pt, Au and Hf or an alloy of two or more of them.

In addition, the passivation layer 150 may be formed on the upper surface or the side surface of the light emitting structure 110 and the upper surface of the light transmitting electrode layer 130 to prevent electrical short circuit and improve electrical reliability.

For example, the passivation layer 150 may be a nitride layer such as an oxide of $SiO_2$, $Si_xO_y$, $Al_2O_3$, or $TiO_2$, or a nitride layer of $Si_3N_4$, $Si_xN_y$, $SiO_xN_y$, or AlN, it is not limited thereto.

<First and Second Insulating Reflective Layers, First and Second Wetting Layers>

One of the technical problems to be solved in the embodiment is to provide a light emitting device, a light emitting device package, and a lighting device including the same, which can improve light intensity Po by minimizing light absorption by a paste.

In addition, one of the technical problems to be solved in the embodiments is to provide a light emitting device, a light emitting device package, and a light emitting device package, which can solve the problem that the electrical contact area with the electrode or bump of the package body cannot be sufficiently secured, and to provide a lighting device including such a lighting device.

To solve the above technical problems, a light emitting device according to an embodiment includes a first insulating reflective layer 161 disposed on a side surface and a part of an upper surface of the first electrode 141 to expose an upper surface of the first electrode 141, a second insulating reflective layer 162 disposed on a side surface and a part of an upper surface of the second electrode 142 so as to expose an upper surface of the second electrode 142; a first wetting layer 171 disposed on the first electrode 141 and first insulating reflective layer 161; and a second wetting layer 172 disposed on the second insulating reflective layer 162 and the second electrode 142.

The first insulating reflective layer 161 is disposed on the side surface and a part of the upper surface of the first electrode 141 so as to expose the upper surface of the first electrode 141, and the second insulating reflective layer 162 is disposed on the side surface and the upper surface of the second electrode 142, the upper surface of the second electrode 142 is exposed to reflect light emitted from the active layer 114 of the light emitting structure 110 to minimize light absorption, light intensity Po can be improved, and a light emitting device package having the technical effect can be provided.

The first and second insulating reflective layers 161 and 162 may include DBR (Distributed Bragg Reflector) or ODR (Omni Directional Reflector), but it is not limited thereto.

For example, the first and second insulating reflective layers 161 and 162 are made of an insulating material, and may have a DBR structure such as a material having a high reflectance for reflecting light emitted from the active layer 114.

For example, the first and second insulating reflective layers 161 and 162 may have a DBR structure in which at least two materials having different refractive indexes are repeatedly arranged from several times to several tens of times.

For example, the first and second insulating reflective layers 161 and 162 may be $TiO_2$ and $SiO_2$, or $Ta_2O_5$ and $SiO_2$.

The first and second insulating reflective layers 161 and 162 may include an omni directional reflector (ODR) layer. The ODR layers of the first and second insulating reflective layers 161 and 162 may include, the light emitting structure 110 may have a lower refractive index than the light emitting structure 110.

The ODR layers of the first and second insulating reflective layers 161 and 162 may be selected to have a low refractive index which is greatly different from the refractive index of the material of the light emitting structure 110 to provide a reflective function.

The ODR layers of the first and second insulating reflective layers 161 and 162 may include an oxide or a nitride.

For example, the ODR layers of the first and second insulating reflective layers 161 and 162 may include at least one selected from the group consisting of $SiO_2$, $SiN_x$, and the like.

Also, the first and second insulating reflective layers 161 and 162 may include an insulating layer in some areas but may include a conductive layer in the other area.

For example, the first and second insulating reflective layers 161 and 162 may be formed of a plurality of layers including an insulating layer and a conductive layer.

For example, the first and second insulating reflective layers 161 and 162 may include a dielectric layer, a polymer layer, a metal layer, or a semiconductor layer such as AlGaInP.

Accordingly, the first and second insulating reflective layers 161 and 162 may be formed of a material selected from the group consisting of $TiO_2$, $SiO_2$, SiNx, MgO, indium-tin-oxide (ITO), indium-zinc- (Indium-Zinc-Tin-Oxide), IZO (Indium-Aluminum-Zinc-Oxide), GZO (Gallium-Zinc-Oxide), IGZO (Indium-Gallium-Al, Ni, Ti, Zn, Rh, Mg, Pd, Ru, Pt, Ir, or an alloy of these metals, such as indium-gallium-tin-oxide (IGTO) and the like.

Accordingly, according to the embodiment, a light emitting device capable of improving the light intensity Po by minimizing light absorption by reflecting light emitted from the active layer, which is a light emitting layer, in the first and second insulating reflective layers 161 and 162, a package and a lighting device including the same can be provided.

In addition, according to the embodiment, light absorption can be minimized. Therefore, when the light emitting device is mounted in the form of a flip chip, light emission can be performed in six directions based on the light emitting structure.

For example, FIG. 2 is characteristic data of the light emitting device package according to the comparative example and the embodiment, and the flux data E of the light emitting device according to the embodiment is improved as compared with the characteristic R of the comparative example.

On the other hand, one of the technical problems to be solved in the embodiments is to provide a light emitting device capable of improving electrical reliability.

In this application, the first and second wetting layers 171 and 172, which will be described later, can be employed to improve the electrical reliability.

On the other hand, in this application, the arrangement relationship of the insulating reflective layer and the passivation layer 150 can be controlled to further improve the electrical reliability.

For example, in the embodiment, the second insulating reflective layer 162 may include a DBR (Distributed Bragg Reflector) layer for improving the light output by maximizing the reflection function while being insulating. Such a DBR layer may have poor step coverage, so the electrical reliability in the second wet layer 172 to be formed later may be deteriorated.

FIG. 1b is a partially enlarged view (A) of the light emitting device according to the first embodiment shown in FIG. 1a, and the second wetting layer 172 is omitted.

Referring to FIG. 1b, one end 162E of the second insulating reflective layer 162 is spaced apart from the upper end 150E of the passivation layer by a predetermined distance D in the embodiment, by providing the reflective layer 162 on the passivation layer upper surface 150T1, the step coverage of the second insulating reflective layer 162 can be improved and the electrical reliability can be significantly improved.

In addition, the second insulating reflective layer 162 may be disposed further inside than one end 110E of the light emitting structure.

Accordingly, the second insulating reflective layer 162 is disposed on the passivation layer upper surface 150T1, thereby improving the step coverage of the second insulating reflective layer 162, and thereby further improving the electrical reliability.

In addition, when the passivation layer 150 is disposed to the upper surface of the transparent electrode layer 130, a step is generated in the passivation layer 150 to be formed, and the second insulating reflective layer 162 disposed on the passivation layer 150, the step coverage may be lowered, so that the electrical reliability in the second wet layer 172 to be formed later can be lowered.

Thus, in order to prevent such a technical problem, it is possible to prevent a step from being generated in the passivation layer 150 by disposing the upper surface 130T of the light-transmitting electrode layer higher than the first upper surface 150T1 of the passivation layer.

Accordingly, in the embodiment, the step coverage of the second insulating reflective layer 162 can be improved by arranging the second insulating reflective layer 162 together with the upper surface 130T of the light-transmitting electrode layer and the first upper surface 150T1 of the passivation layer, the electrical reliability in the second wet layer 172 to be formed can be further improved.

In addition, in the embodiment, the passivation layer 150 has a predetermined first through-hole, and the transparent electrode 130 formed thereafter may be exposed by the first through-hole.

The upper surface 130T of the exposed transparent electrode is controlled to be higher than or equal to the upper surface of the passivation layer 150 to improve the step coverage of the second insulating reflective layer 162 formed thereafter to further improve the electrical reliability.

The embodiment further includes a second electrode 142 disposed on the second conductivity type semiconductor layer 116. The exposed light transmitting electrode 130 may be formed on the second conductivity type semiconductor layer 116, the horizontal width of the exposed transparent electrode 130 may be greater than the horizontal width of the second electrode 142 to improve electrical reliability.

The embodiment further includes a first insulating reflective layer 161 disposed on the first electrode 141 and a second insulating reflective layer 162 disposed on the second electrode 142. The passivation layer 150 may contact the first insulating reflective layer 161 and the second insulating reflective layer 162, thereby further improving the electrical reliability.

FIG. 1c is another enlarged view (B) of the light emitting device according to the first embodiment.

Referring to FIG. 1c, in order to further improve the electrical reliability, the upper surface 130T of the translucent electrode layer is disposed at the same height as the second upper surface 150T2 of the passivation layer, the second upper surface 150T2 of the passivation layer, it is possible to further prevent the step on the upper surface 130T of the electrode layer.

Accordingly, in the embodiment, the second insulating reflective layer 162 to be formed later is disposed without a step difference from the upper surface 130T of the light-transmitting electrode layer and the second upper surface 150T2 of the passivation layer, thereby improving the step coverage of the second insulating reflective layer 162 such that the electrical reliability in the second wet layer 172 to be formed later can be greatly improved.

Next, the embodiment includes a first wetting layer 171 disposed on the first electrode 141, and a first insulating reflective layer 161, and a second wetting layer 172 disposed on the second electrode 142 and a second insulating reflective layer 162 to improve the reliability of subsequent packaging processes.

For example, the first and second wetting layers 171 and 172 are formed of Au, AuTi, or the like, such that the packaging factory can be stably operated.

The first and second wetting layers 171 and 172 may be formed of a material selected from the group consisting of Ti, Al, In, Ir, Ta, Pd, Co, Cr, Mg, Zn, Ni, Si, Ge, Ag, Layer or multi-layer using at least one material or alloy selected from among Pt, Ru, Rh, ZnO, IrOx, RuOx, NiO, RuOx/ITO, Ni/IrOx/Au and Ni/IrOx/Au/ITO etc.

The horizontal width W2 of the second wetting layer 172 is smaller than the horizontal width W1 of the second insulating reflective layer 162 such that the second insulating reflection layer 162 reflects light traveling to the second wetting layer 172 to improve light efficiency, also the horizontal width W2 of the second wetting layer 172 is formed to be larger than the horizontal width of the second electrode 142 such that there is a complex technical effect that the mounting process can be performed stably and the mechanical and electrical reliability can be improved.

Since the horizontal width W2 of the second wetting layer 172 may be greater than the horizontal width of the second electrode 142 and the horizontal width of the first wetting layer 173 may be larger than the horizontal width of the second electrode 142, the electrical contact area with the electrodes, bumps, etc. of the package body can be sufficiently secured, such that it is possible to provide a light emitting device, a light emitting device package, and a lighting device including the same, which have a complex technical effect that can improve electrical reliability as well as increase brightness.

The second insulating layer 162 may have a second through hole (not shown) on the second electrode 142 and the second wetting layer 172 may be formed on the second insulating layer 162 through the second through hole of the second electrode 142 to improve electrical reliability.

Also, the second insulating layer 162 may have a second through hole (not shown) on the second electrode 142 and the second wetting layer 172 may be electrically connected to the second electrode 142 through the second through hole such that the electrical reliability can be improved.

In addition, since the upper surface of the second wetting layer 172 has recesses in the embodiment, the contact area can be widened in a subsequent mounting process to improve the bonding force.

Second Embodiment

FIG. 3 is a perspective view of the light emitting device 102 according to the second embodiment, FIG. 4 is a plan projective view of the package 102 of the light emitting device according to the second embodiment, and FIG. 5 is a sectional view taken along the line A-A' in FIG. 4 in the package 102 of FIG. 4.

The second embodiment can employ the technical features of the first embodiment, and the following description will focus on the main features of the second embodiment.

Referring to FIG. 3, the light emitting device 102 according to the second embodiment may include at least one of a substrate 105, a light emitting structure 110, a third insulating reflective layer 163, a fourth insulating reflective layer 164, a third wetting layer a wetting layer 173, a fourth wetting layer 174, and a passivation layer 150.

For example, referring to FIG. 4, the light emitting device 102 according to the second embodiment may include at least one of a light emitting structure 110, a plurality of third electrodes 143, a plurality of fourth electrodes 144, a third insulating layer 163, a fourth insulating reflective layer 164, a third wetting layer 173, a fourth wetting layer 174, and a passivation layer 150.

The plurality of third electrodes 143 may include a third A electrode 141A and a third B electrode 141B and the plurality of fourth electrodes 144 may include a fourth A electrode 142A, a fourth B electrode 142B, and a fourth C electrode 142C.

Referring to FIG. 4, the plurality of third electrodes 143 are physically spaced from each other in the embodiment, and the plurality of third electrodes 143 can be electrically connected to each other by the third wetting layer 173.

As a result, the third electrode 143 is disposed on the light emitting structure 110, and the brightness of light can be improved as the space for absorbing light is significantly lowered.

For example, in the embodiment, the plurality of third electrodes 143 may include a third A electrode 141A and a third B electrode 141B, and the third A electrode 141A and the third B electrode 141B may be physically spaced from each other, and the third 3A electrode 141A and the third B electrode 141B may be electrically connected to each other by the third wetting layer 173.

Accordingly, although the third electrode 143 is disposed on the light emitting structure 110, the third electrode 141A and the third B electrode 141B are physically spaced from each other, the third electrode 141A and the third B electrode 141B are arranged in the form of branch electrodes to contribute to current diffusion, thereby increasing the light emission efficiency such that there is a complex technical effect that the brightness can be improved.

In addition, the plurality of fourth electrodes 144 may be physically spaced from each other, and the plurality of fourth electrodes 144 may be electrically connected to each other by the fourth wetting layer 174.

Accordingly, although the fourth electrode 144 is disposed on the light emitting structure 110, it is possible to improve the light intensity as the light absorbability is lowered, and the light intensity can be increased by increasing the electrical diffusion efficiency.

For example, in an embodiment, the plurality of fourth electrodes 144 may include a fourth A electrode 142A, a fourth B electrode 142B, and a fourth C electrode 142C, and the fourth A electrode 142A, the fourth B electrode 142B and the fourth C electrode 142C are physically spaced from each other and can be electrically connected to each other by the fourth wetting layer 174.

Accordingly, the fourth electrode 144 is disposed in the form of branch electrodes such as the fourth A electrode 142A, the fourth B electrode 142B, and the fourth C electrode 142C, thereby contributing to the current diffusion to improve the luminous efficiency. Although the fourth electrode 144 is disposed on the light emitting structure 110, the fourth electrode 144 is connected to the, and the fourth electrode 144B, The fourth A electrode 142A, the fourth B electrode 142B, the fourth C electrode 142C of the fourth electrode 144 are physically spaced from each other by a minimum distance to an area occupied by the fourth electrode 144 on the light emitting structure, thereby there is a complex technical effect of reducing the possibility of light absorption and improving the light efficiency.

Next FIG. 5 is a cross-sectional view taken along the line A-A' in FIG. 4 in the package 102 of the light emitting device according to the second embodiment.

Referring to FIG. 5, the light emitting device 102 according to the second embodiment includes at least one of a light emitting structure 110 including a first conductivity type semiconductor layer 112, an active layer 114 disposed on the first conductivity type semiconductor layer 112, and a second conductivity type semiconductor layer 116 disposed on the active layer 114, a substrate 105 disposed below the first conductivity type semiconductor layer 112, a plurality of third electrodes 143 disposed on the first conductivity type semiconductor layer 112 from which the second conductivity type semiconductor layer 116 and the active layer 114 are partially removed and exposed; a plurality of fourth electrodes 144 disposed on the second conductivity type semiconductor layer 116 and a third insulation layer 163 disposed on the side and upper surface of the plurality of third electrodes 143 to expose the upper surfaces of the plurality of third electrodes 143, a fourth insulation layer 164 disposed on the side surfaces and a part of the upper surface of the plurality of fourth electrodes 144 so as to expose the upper surfaces of the plurality of fourth electrodes 144, a third wetting layer 173 disposed on the third insulating layer 163 and the plurality of third electrodes 143, and a fourth wetting layer 174 disposed on the fourth insulating layer 164 and the plurality of fourth electrodes 144.

As FIG. 5 is a cross-sectional view taken along the line A-A' in FIG. 4, and a cross-sectional view of the third A electrode 141A of the third electrode 143 and the fourth B electrode 142B of the fourth electrode 144 is shown.

The third A electrode 141A may include a third A pad electrode 141a and a third A branch electrode 141b and the fourth B electrode 142B may include a fourth B pad electrode 142a and a fourth B branch electrode 142b, but it is not limited thereto.

The third A pad electrode 141a and the fourth B pad electrode 142a may be electrically connected to the third and fourth wetting layers 173 and 174, respectively.

The third A and fourth B branched electrodes 141b and 142b may have branch electrodes extending from the third A and fourth B pad electrodes 141a and 142a, respectively.

According to the embodiment, the plurality of third electrodes 143 may be physically spaced from each other, and the plurality of third electrodes 143 may be electrically connected to each other by the third wetting layer 173.

As a result, the third electrode 143 is disposed on the light emitting structure 110, and the brightness of light can be improved as the space for absorbing light is significantly lowered.

For example, although the third electrode 143 is disposed on the light emitting structure 110, the third A electrode 141A and the third B electrode 141B are physically spaced from each other, and the third A electrode 141A and the third B electrode 141B are arranged in the form of branch electrodes, thereby contributing to the current diffusion, and the luminous efficiency such that the brightness can be improved.

In addition, the plurality of fourth electrodes 144 may be physically spaced from each other, and the plurality of fourth electrodes 144 may be electrically connected to each other by the fourth wetting layer 174.

Accordingly, although the fourth electrode 144 is disposed on the light emitting structure 110, it is possible to improve the light intensity as the light absorbability is lowered, and the light intensity can be increased by increasing the electrical diffusion efficiency.

Accordingly, the fourth electrode 144 is disposed in the form of branch electrodes such as the fourth A electrode 142A, the fourth B electrode 142B, and the fourth C electrode 142C, thereby contributing to the current diffusion to improve the luminous efficiency. Although the fourth electrode 144 is disposed on the light emitting structure 110, the fourth electrode 144 is connected to the, and the fourth electrode 144B. The fourth A electrode 142A, the fourth B electrode 142B, the fourth C electrode 142C of the fourth electrode 144 are physically spaced from each other by a minimum distance to an area occupied by the fourth electrode 144 on the light emitting structure, thereby there is a complex technical effect of reducing the possibility of light absorption and improving the light efficiency.

According to the embodiment, the third insulating reflective layer 163 is disposed below the third wetting layer 173 that electrically connects the third A electrode 141A and the third B electrode 141B to each other, the light absorption in the third wetting layer 173 can be minimized and the brightness can be improved.

For example, a third insulating reflective layer 163 may be disposed below a third wetting layer 173 that electrically connects the third A electrode 141A and the third B electrode 141B, the horizontal width of the third insulating reflective layer 163 is greater than the horizontal width of the third wetting layer 173 so that the emitted light is reflected by the third insulating reflective layer 163, such that light absorption in the third wetting layer 173 can be minimized and the brightness can be improved.

According to the embodiment, a fourth insulating reflective layer 164 is formed under the fourth wedging layer 174 that electrically connects the fourth A electrode 142A, the fourth B electrode 142B and the fourth C electrode 142C to each other. The light absorption in the fourth wetting layer 174 can be minimized and the brightness can be improved.

For example, a fourth insulating reflective layer 164 is formed under the fourth wedging layer 174 that electrically connects the fourth A electrode 142A, the fourth B electrode 142B, and the fourth C electrode 142C to each other. And the fourth insulating reflective layer 164 is formed to have a larger horizontal width than the horizontal width of the fourth wetting layer 174 so that light emitted from the fourth insulating reflective layer 164 is reflected by the fourth insulating reflective layer 164, Light absorption in the fourth wedging layer 174 can be minimized to improve the brightness.

Another one of the technical problems to be solved in the embodiment is to provide a light emitting device capable of improving electrical reliability.

In this application, the third and fourth wetting layers 173 and 174 described above can be employed to improve electrical reliability.

On the other hand, in this application, the arrangement relationship of the insulating reflective layer and the passivation layer 150 can be controlled to further improve the electrical reliability.

For example, in an embodiment, the fourth insulating reflective layer 164 may include a DBR (Distributed Bragg Reflector) layer for improving the light output by maximizing the reflection function while being insulating. Such a DBR layer may have poor step coverage, so the electrical reliability in the fourth wetting layer 174 to be formed thereafter may be lowered.

Referring to FIG. 5, one end of the fourth insulating reflective layer 164 is spaced apart from the upper end of the passivation layer 150 by a predetermined distance D, such that the fourth insulating reflective layer 164 is spaced apart from the upper end of the passivation layer 150, the step coverage of the fourth insulating reflective layer 164 can be improved and the electrical reliability can be further remarkably improved by the fourth insulating reflective layer 164 being disposed on the upper surface of the passivation layer 150.

In addition, the fourth insulating reflective layer 164 may be disposed inwardly from one end of the light emitting structure 110.

Accordingly, the fourth insulating reflective layer 164 is disposed on the passivation layer 150, thereby improving the step coverage of the fourth insulating reflective layer 164 and further improving the electrical reliability.

Third Embodiment

FIG. 6 is a sectional view of the package 102 of the light emitting device according to the third embodiment.

The light emitting device according to the third embodiment may employ the technical features of the first or second embodiment, and the following description will focus on the main features of the third embodiment.

The light emitting device according to the third embodiment may include a first reflective layer 181 disposed below the plurality of third electrodes 143 and a second reflective layer 182 disposed below the plurality of fourth electrodes 144.

The first reflective layer 181 and the second reflective layer 182 may be formed of a metal layer including Al, Ag, or an alloy including Al or Ag.

According to the third embodiment, although the third electrode 143 is disposed on the light emitting structure 110, the third A electrode 141A and the third B electrode 141B are physically spaced from each other, the third electrode 141A and the third B electrode 141B are arranged in the form of branch electrodes to contribute to the current diffusion, the luminous efficiency can be improved and the luminous intensity can be improved. By disposing the first reflective layer 181 below the third 3A electrode 141A and the third B electrode 141B, there are complex technical effects that can be achieved such as the luminous intensity being improved by blocking the absorption of light in the branch electrodes.

In addition, in the third embodiment, the fourth electrode 144 is disposed in the form of branch electrodes such as a fourth A electrode 142A, a fourth electrode 142B, and a fourth C electrode 142C, thereby contributing to current diffusion, so that the light intensity can be improved. Also, although the fourth electrode 144 is disposed on the light emitting structure 110, the fourth electrode 144 is disposed between the fourth A electrode 142A, the fourth B electrode 142B, the fourth C electrode 142C, the fourth electrode 144 can be minimized to an area occupied by the fourth electrode 144 on the light emitting structure, thereby lowering the light absorption possibility and improving the light efficiency. Also, the second reflective layer 182 is disposed below the fourth A electrode 142A, the fourth B electrode 142B and the fourth C electrode 142C to prevent light absorption at the branch electrodes such that the luminous intensity can be improved.

[Manufacturing Method]

Hereinafter, the manufacturing process of the light emitting device according to the embodiment will be described with reference to FIGS. 7 to 12.

Hereinafter, the manufacturing method according to the first embodiment will be described, but the manufacturing method is not limited thereto.

First, a substrate 105 may be prepared as shown in FIG. 7, and a light emitting structure 110 may be formed thereon.

The substrate 105 may be formed of a material having excellent thermal conductivity or a material having excellent light transparency to improve thermal reliability and improve light extraction efficiency.

For example, the substrate 105 may be a conductive substrate or an insulating substrate.

For example, at least one of GaAs, sapphire (Al2O3), SiC, Si, GaN, ZnO, GaP, InP, Ge and $Ga_2O_3$ may be used as the substrate 105.

A predetermined light extraction pattern P, for example, PSS, may be formed on the upper surface of the substrate 105 to improve light extraction efficiency.

In addition, in the embodiment, the substrate 105 may have a concavo-convex structure through lower patterning to improve the light extraction efficiency.

For example, the light extraction may be improved by wet etching or the like at about 300° C. by using $H_3Po_4$ or the like on the lower surface of the substrate 105 to form a conical pattern (not shown) but it is not limited thereto.

In an embodiment, a buffer layer (not shown) may be formed on the substrate 105.

The buffer layer can relieve lattice mismatching between the light emitting structure 110 and the substrate 105 to be formed later.

The buffer layer may be formed of at least one of Group III-V compound semiconductor such as GaN, InN, AlN, InGaN, AlGaN, InAlGaN, and AlInN.

An undoped semiconductor layer (not shown) may be formed on the buffer layer, but it is not limited thereto.

Next, a light emitting structure 110 is formed on the substrate 105 or the buffer layer. The light emitting structure 110 includes a first conductivity type semiconductor layer 112, an active layer 114, and a second conductivity type semiconductor layer 116.

The first conductivity type semiconductor layer 112 may be formed of a compound semiconductor such as a Group III-V, Group II-VI, or the like, and may be doped with a first conductive dopant.

For example, when the first conductivity type semiconductor layer 112 is an n-type semiconductor layer, the n-type dopant may include Si, Ge, Sn, Se, and Te.

The first conductivity type semiconductor layer 112 may include a semiconductor material having a composition formula of $In_xAl_yGa_{1-x-y}N$ ($0 \leq x \leq 1$, $0 \leq y \leq 1$, $0 \leq x+y \leq 1$).

For example, the first conductivity type semiconductor layer 112 may be formed of one or more of GaN, InN, AlN, InGaN, AlGaN, InAlGaN, AlInN, AlGaAs, InGaAs, AlInGaAs, GaP, AlGaP, InGaP, AlInGaP.

The active layer 114 may be formed of at least one of a single quantum well structure, a multi quantum well (MQW) structure, a quantum-wire structure, or a quantum dot structure.

The active layer 114 may include a quantum well (not shown)/a quantum wall (not shown) structure.

For example, the active layer 114 may be formed of any one or more pairs of InGaN/GaN, InGaN/InGaN, GaN/AlGaN, InAlGaN/GaN, GaAs/AlGaAs, InGaP/AlGaP or GaP/AlGaP, but it does not limited thereto.

An electron blocking layer (not shown) is formed on the active layer 114 to serve as electron blocking and cladding of the active layer 114, thereby improving the luminous efficiency.

For example, the electron blocking layer may be formed of $Al_xIn_yGa_{(1-x-y)}N$ ($0 \leq x \leq 1$, $0 \leq y \leq 1$) based semiconductor and may have a higher energy band than the energy band gap of the active layer 114.

In the embodiment, the electron blocking layer can effectively block the electrons that are ion-implanted into the p-type and overflow, and increase the hole injection efficiency.

The second conductivity type semiconductor layer 116 may be formed of a semiconductor compound.

For example, the second conductivity type semiconductor layer 116 may be formed of a compound semiconductor such as a Group III-V, a Group II-VI, or the like, and may be doped with a second conductive dopant.

The second conductivity type semiconductor layer 116 may be a Group III-V compound semiconductor doped with a second conductive dopant, such as $In_xAl_yGa_{1-x-y}N$ ($0 \leq x \leq 1$, $0 \leq y \leq 1$, $0 \leq x+y \leq 1$).

When the second conductivity type semiconductor layer 116 is a p-type semiconductor layer, the second conductive dopant may include Mg, Zn, Ca, Sr, and Ba as p-type dopants.

In the light emitting structure 110 of the embodiment, the first conductivity type semiconductor layer 112 may be an n-type semiconductor layer, and the second conductivity type semiconductor layer 116 may be a p-type semiconductor layer.

Also, on the second conductivity type semiconductor layer 116, a semiconductor (e.g., an n-type semiconductor) (not shown) having a polarity opposite to that of the second conductivity type semiconductor may be formed.

Accordingly, the light emitting structure 110 may have any one of an n-p junction structure, a p-n junction structure, an n-p-n junction structure, and a p-n-p junction structure.

Next, the current diffusion layer 120 may be formed on the second conductivity type semiconductor layer 116 at a position corresponding to the second electrode 142, which is formed later for current diffusion.

The current diffusion layer 120 may be formed of an oxide such as $SiO_2$, $Si_xO_y$, $Al_2O_3$, or $TiO_2$, or a nitride layer such as $Si_3N_4$, $Si_xN_y$, $SiO_xN_y$, or AlN, but it is not limited thereto.

The current diffusion layer 120 is formed to have a horizontal width equal to or larger than the horizontal width of the second electrode 142 to be formed later, thereby preventing the current concentration at the lower side of the second electrode 142, thereby improving the electrical reliability.

Next, as shown FIG. 8, a mesa etching process is performed to remove a portion of the second conductivity type semiconductor layer 116 and the active layer 114 of the light emitting structure 110 to form a mesa region R in which a part of the upper surface of the first conductivity type semiconductor layer 112 is exposed.

Thereafter, the light-transmitting electrode 122 is formed on the second conductivity type semiconductor layer 116 to improve the current diffusion to increase the light output and improve the light extraction efficiency.

In an embodiment, the transparent electrode layer 140 may be formed of a good material in electrical contact with a semiconductor.

For example, the light transmitting electrode layer 140 may be formed of indium tin oxide (ITO), indium zinc oxide (IZO), indium zinc oxide (IZTO), indium aluminum zinc oxide (IAZO), indium gallium zinc oxide (ZnO), indium gallium tin oxide (AZO), aluminum zinc oxide (AZO), antimony tin oxide (ATO), gallium zinc oxide (GZO), IZON nitride, AGZO Or a multi-layer structure including at least one of them.

Referring to FIG. 9, the first electrode 141 and the second electrode 142 may be formed to be electrically connected to the light emitting structure 110.

For example, the embodiment may include a first electrode 141 disposed on a top surface of a first conductivity type semiconductor layer 112 exposed by removing a part of the second conductivity type semiconductor layer 116 and a part of the active layer 114, and a second electrode 142 disposed on the second conductivity type semiconductor layer 116, respectively.

The second electrode 142 may be disposed on the transparent electrode layer 130 at a position overlapping with the current diffusion layer 120.

The first electrode 141 and the second electrode 142 may have a single-layer structure or a multi-layer structure.

For example, the first electrode 141 and the second electrode 142 may be ohmic electrodes.

For example, the first electrode 141 and the second electrode 142 may be formed of one selected from the group consisting of ZnO, IrOx, RuOx, NiO, RuOx/ITO, Ni/IrOx/Au, aat least one of Cr, Ti, Al, Rh, Pd, Ir, Ru, Mg, Zn, Pt, Au and Hf or an alloy of two or more of them Referring to FIG. 10, a passivation layer 130 may be formed on the light emitting structure 110 and the light transmitting electrode layer 140, and the passivation layer 130 may be an oxide or a nitride.

The passivation layer 150 may be formed of a single layer or a plurality of layers such as an oxide such as $SiO_2$ or a nitride layer such as SixNy, but it is not limited thereto.

Referring to FIG. 11a, a first insulating reflective layer 161 is disposed on a side surface and a part of an upper surface of the first electrode 141 so as to expose the upper surface of the first electrode 141, the second insulating reflective layer 162 may be formed on a side surface and a part of the upper surface of the second electrode 142 to expose the upper surface of the second electrode 142.

The first insulating reflective layer 161 is disposed on the side surface and a part of the upper surface of the first electrode 141 so as to expose the upper surface of the first electrode 141 and the second insulating reflective layer 162 is disposed on the upper surface of the second electrode 142, the upper surface of the second electrode 142 is exposed on the side surface and a part of the upper surface of the two electrodes 142 to reflect light emitted from the active layer 114 of the light emitting structure 110 to minimize light absorption, light intensity Po can be improved, and a light emitting device package having the technical effect can be provided.

The first and second insulating reflective layers 161 and 162 may include DBR (Distributed Bragg Reflector) or ODR (Omni Directional Reflector), but it is not limited thereto.

For example, the first and second insulating reflective layers 161 and 162 are made of an insulating material, and may have a DBR structure such as a material having a high reflectance for reflecting light emitted from the active layer 114.

For example, the first and second insulating reflective layers 161 and 162 may have a DBR structure in which at least two materials having different refractive indexes are repeatedly arranged from several times to several tens of times.

For example, the first and second insulating reflective layers 161 and 162 may be $TiO_2$ and $SiO_2$, or $Ta_2O_5$ and $SiO_2$.

The first and second insulating reflective layers 161 and 162 may include an ODR (Omni Directional Reflector) layer. For example, the ODR layers of the first and second insulating reflective layers 161 and 162 may be implemented to have a lower refractive index than that of the structure (110).

The ODR layers of the first and second insulating reflective layers 161 and 162 may be selected to have a low refractive index which is greatly different from the refractive index of the material of the light emitting structure 110 to provide a reflective function.

The ODR layers of the first and second insulating reflective layers 161 and 162 may include an oxide or a nitride.

For example, the ODR layers of the first and second insulating reflective layers 161 and 162 may include at least one selected from the group consisting of $SiO_2$, $SiN_x$, and the like.

Accordingly, according to the embodiment, a light emitting device capable of improving the light intensity Po by minimizing light absorption by reflecting light emitted from the active layer, which is a light emitting layer, in the first and second insulating reflective layers 161 and 162, a package and a lighting device including the same can be provided.

In addition, according to the embodiment, light absorption can be minimized. Therefore, when the light emitting device is mounted in the form of a flip chip, light emission can be performed in six directions based on the light emitting structure.

One of the technical problems to be solved in the embodiment is to provide a light emitting device capable of improving electrical reliability.

In this application, the first and second wetting layers 171 and 172, which will be described later, can be employed to improve the electrical reliability.

On the other hand, in this application, the arrangement relationship of the insulating reflective layer and the passivation layer 150 can be controlled to further improve the electrical reliability.

For example, in the embodiment, the second insulating reflective layer 162 may include a DBR (Distributed Bragg Reflector) layer for improving the light output by maximizing the reflection function while being insulating. Such a DBR layer is not good in step coverage, so the electrical reliability in the second wet layer 172 to be formed later may be deteriorated.

FIG. 11b is a partially enlarged view (A) of the light emitting device according to the first embodiment.

FIG. 11b, one end 162E of the second insulating reflective layer 162 is spaced apart from the upper end 150E of the passivation layer by a predetermined distance D, so that the second insulating reflective layer 162 are disposed on the upper surface 150T1 of the passivation layer, the step coverage of the second insulating reflective layer 162 can be improved and the electrical reliability can be further improved remarkably.

In addition, the second insulating reflective layer 162 may be disposed further inside than one end 110E of the light emitting structure.

Accordingly, the second insulating reflective layer 162 is disposed on the passivation layer upper surface 150T1, thereby improving the step coverage of the second insulating reflective layer 162, and thereby further improving the electrical reliability.

In addition, when the passivation layer 150 is disposed to the upper surface of the transparent electrode layer 130, a step is generated in the passivation layer 150 to be formed, and a step coverage of the second insulating reflective layer 162 disposed on the passivation layer 150 may be lowered and the electrical reliability in the second wet layer 172 to be formed later may be lowered.

Thus, in order to prevent such a technical problem, it is possible to prevent a step from being generated in the passivation layer 150 by disposing the upper surface 130T of the light-transmitting electrode layer higher than the first upper surface 150T1 of the passivation layer.

Accordingly, in the embodiment, the step coverage of the second insulating reflective layer 162 can be improved by arranging the second insulating reflective layer 162 together with the upper surface 130T of the light-transmitting electrode layer and the first upper surface 150T1 of the passivation layer, the electrical reliability in the second wet layer 172 to be formed can be further improved.

FIG. 11c is another enlarged view (B) of the light emitting device according to the first embodiment.

Referring to FIG. 11c, in order to further improve the electrical reliability, the upper surface 130T of the translucent electrode layer is disposed at the same height as the second upper surface 150T2 of the passivation layer, and the second upper surface 150T2 of the passivation layer and the upper surface, it is possible to further prevent the step on the upper surface 130T of the electrode layer.

Accordingly, in the embodiment, the second insulating reflective layer 162 to be formed later is disposed without a step difference from the upper surface 130T of the light-transmitting electrode layer and the second upper surface 150T2 of the passivation layer, thereby improving the step coverage of the second insulating reflective layer 162 such that the electrical reliability in the second wet layer 172 to be formed later can be greatly improved.

Next referring to FIG. 12, a first wetting layer 171 disposed on the first insulating reflective layer 161 and the first electrode 141, and a second wetting layer 172 disposed on the second insulating reflective layer 162 and the second electrode 142 may be formed.

The embodiment includes a first wetting layer 171 disposed on the first insulating reflective layer 161 and the first electrode 141, and a second wetting layer 172 disposed on the second insulating reflective layer 162 and the second electrode 142 to improve the reliability of the subsequent packaging process.

For example, the first and second wetting layers 171 and 172 are formed of Au, AuTi, or the like, so that the packaging factory can be stably operated.

The horizontal width W2 of the second wetting layer 172 is smaller than the horizontal width W1 of the second insulating reflective layer 162 so that the second insulating reflective layer 162 is formed on the second wetting layer 172, and the horizontal width W2 of the second wetting layer 172 is formed to be larger than the horizontal width of the second electrode 142. As a result the mechanical and electrical reliability can be improved.

Also, the horizontal width W2 of the second wetting layer 172 is smaller than the horizontal width W1 of the second insulating reflective layer 162 so that the second insulating reflective layer 162 is formed on the second wetting layer 172) to improve light efficiency.

In addition, since the horizontal width W2 of the second wetting layer 172 is formed to be larger than the horizontal width of the second electrode 142, the mounting process can be performed stably and there is a technical effect such as the mechanical and electrical reliability being improved.

Also, the horizontal width W2 of the second wetting layer 172 may be greater than the horizontal width of the second electrode 142 and the horizontal width of the first wetting layer 173 may be larger than the horizontal width of the second electrode 142. Since the electrical contact area with the electrodes, bumps, etc. of the package body can be sufficiently secured, the combined technical effect that the electrical reliability can be improved as well as the brightness increase can be obtained a light emitting device package, and a lighting device including the same.

Embodiments can provide a light emitting device, a light emitting device package, and a lighting device including the light emitting device, which can improve the light intensity Po by minimizing light absorption by the paste.

Embodiments can provide a light emitting device, a light emitting device package, and a lighting device including the same, which can solve the problem that the electrical contact area between the electrode of the package body and the bump or the like cannot be sufficiently secured.

Also, the embodiment can provide a light emitting device, a light emitting device package, and a lighting device including the same, which can improve light efficiency by minimizing light absorption by the branched electrodes.

[Light Emitting Device Package]

FIG. 13 is a cross-sectional view of a package of a light emitting device according to an embodiment.

The package of the light emitting device according to the embodiment includes a package body 205, a first package electrode 211 disposed on the package body 205, a second package electrode 212, a light emitting device 100 and a molding part 230 having a phosphor (not shown) disposed on the light emitting device 100.

The light emitting device 100 may be a light emitting device according to the first embodiment, but the present invention is not limited thereto.

The light emitting device 100 may be electrically connected to the first package electrode 211 and the second package electrode 212.

For example, the light emitting device 100 may be electrically connected to the first package electrode 211 and the second package electrode 212 through the first bump 221 and the second bump 222.

The first bump 221 and the second bump 222 may be formed of at least one of a high reflective metal having a reflectivity of 80% or more, for example, Ag, Au, or Al, or an alloy thereof to prevent light absorption by the electrode, the efficiency can be improved.

For example, the first bump 221 and the second bump 222 may be formed of a material selected from the group consisting of Ti, Cu, Ni, Au, Cr, Ta, And may be formed of at least one of platinum (Pt), tin (Sn), silver (Ag), phosphorus (P), or a selective alloy thereof.

Also, the light emitting device 100 may be mounted by Eutectic bonding without bump.

A first wetting layer 171 disposed on the first insulating reflective layer 161 and the first electrode 141 and a second insulating layer 162 disposed on the second insulating reflective layer 162, and a second wetting layer 172 disposed on the first insulating layer 142 to improve the mechanical and electrical reliability of the light emitting device package.

For example, referring to FIG. 1a, the first and second wetting layers 171 and 172 are formed of Au, AuTi, or the like, so that the packaging factory can be stably operated.

Also, the horizontal width W2 of the second wetting layer 172 is smaller than the horizontal width W1 of the second insulating reflective layer 162 so that the second insulating reflective layer 162 is formed on the second wetting layer 172) to improve light efficiency. In addition, since the horizontal width W2 of the second wetting layer 172 is formed to be larger than the horizontal width of the second electrode 142, the mounting process can be performed stably and there is a technical effect such as the mechanical and electrical reliability being improved.

The horizontal width W2 of the second wetting layer 172 may be greater than the horizontal width of the second electrode 142 and the horizontal width of the first wetting layer 173 may be larger than the horizontal width of the second electrode 142. Since the electrical contact area with the electrodes, bumps, etc. of the package body can be sufficiently secured, the combined technical effect that the electrical reliability can be improved as well as the brightness increase can be obtained A light emitting device package, and a lighting device including the same.

Also, the horizontal width W2 of the second wetting layer 172 may be greater than the horizontal width of the second electrode 142 and the horizontal width of the first wetting layer 173 may be larger than the horizontal width of the second electrode 142. Since the electrical contact area with the electrodes, bumps, etc. of the package body can be sufficiently secured, the combined technical effect that the electrical reliability can be improved as well as the brightness increase can be obtained a light emitting device package, and a lighting device including the same.

[Lighting Device]

FIG. 14 is an exploded perspective view of a lighting apparatus according to an embodiment.

The lighting apparatus according to the embodiment may include a cover 2100, a light source module 2200, a heat discharger 2400, a power supply unit 2600, an inner case 2700, and a socket 2800.

Further, the illumination device according to the embodiment may further include at least one of the member 2300 and the holder 2500.

The light source module 2200 may include a light emitting device or a light emitting device package according to the embodiment.

The light source module 2200 may include a light source unit 2210, a connection plate 2230, and a connector 2250.

The member 2300 is disposed on the upper surface of the heat discharging body 2400 and has guide grooves 2310 through which the plurality of light source portions 2210 and the connector 2250 are inserted.

The holder 2500 blocks the receiving groove 2719 of the insulating portion 2710 of the inner case 2700.

Therefore, the power supply unit 2600 housed in the insulating portion 2710 of the inner case 2700 is sealed.

The holder 2500 has a guide protrusion 2510.

The power supply unit 2600 may include a protrusion 2610, a guide 2630, a base 2650, and an extension 2670.

The inner case 2700 may include a molding part together with the power supply part 2600.

The molding part is a hardened portion of the molding liquid so that the power supply unit 2600 can be fixed inside the inner case 2700.

EXPLANATION OF SYMBOLS

The substrate 105, the light emitting structure 110,

The first conductivity type semiconductor layer 112, the active layer 114, the second conductivity type semiconductor layer 116, The first electrode 141, the second electrode 142, the first insulating reflective layer 161, the second insulating reflective layer 162, A first wetting layer 171, a second wetting layer 172, Embodiments can be employed in a light emitting device package and a lighting apparatus including the same.

Thus, according to the embodiments, it is possible to provide a light emitting device, a light emitting device package, and a lighting device including the same, which can improve light intensity Po by minimizing light absorption by the paste.

Embodiments can provide a light emitting device, a light emitting device package, and a lighting device including the same, which can solve the problem that the electrical contact area between the electrode of the package body and the bump or the like cannot be sufficiently secured.

Also, the embodiment can provide a light emitting device, a light emitting device package, and a lighting device including the same, which can improve light efficiency by minimizing light absorption by the branched electrodes.

The features, structures, effects and the like described in the embodiments are included in at least one embodiment and are not necessarily limited to only one embodiment.

Furthermore, the features, structures, effects and the like illustrated in the embodiments can be combined and modified by other persons skilled in the art to which the embodiments belong.

Accordingly, the contents of such combinations and modifications should be construed as being included in the scope of the embodiments.

While the present invention has been particularly shown and described with reference to exemplary embodiments thereof, it will be understood by those skilled in the art that various changes in form and details may be made therein without departing from the spirit and scope of the invention. It can be seen that the modification and application of branches are possible.

For example, each component specifically shown in the embodiments can be modified and implemented.

It is to be understood that the present invention may be embodied in many other specific forms without departing from the spirit or essential characteristics thereof.

The invention claimed is:

1. A light emitting device, comprising:
   a light emitting structure including a first conductivity type semiconductor layer, a second conductivity type semiconductor layer, and an active layer disposed between the first conductivity type semiconductor layer and the second conductivity type semiconductor layer;
   a passivation layer disposed on the light emitting structure;
   an insulating reflective layer disposed on the passivation layer; and
   a light transmitting electrode on the light emitting structure,
   wherein the passivation layer has a first region disposed on an upper surface of the light emitting structure, and a second region disposed on side surfaces of the first conductivity type semiconductor layer, the second conductivity type semiconductor layer and the active layer,
   wherein the insulating reflective layer is disposed on the first region, and an end portion of the insulating reflective layer is spaced apart from an end portion of the first region,
   wherein the light transmitting electrode is exposed through the passivation layer, and
   wherein the passivation layer has a predetermined first through hole, and the light transmitting electrode is exposed by the predetermined first through hole.

2. The light emitting device of claim 1, wherein the light transmitting electrode is disposed between the passivation layer and the light emitting structure.

3. The light emitting device of claim 2, wherein an upper surface of the light transmitting electrode is disposed higher than the first region of the passivation layer.

4. The light emitting device of claim 2, wherein an upper surface of the light transmitting electrode is disposed at a same height as the first region of the passivation layer.

5. The light emitting device of claim 1, further comprising a second electrode disposed on the second conductivity type semiconductor layer, wherein the exposed light transmitting electrode is disposed between the second conductivity type semiconductor layer and the second electrode, and is electrically connected to the second electrode.

6. The light emitting device of claim 5, further comprising:
   a first electrode,
   wherein a first wetting layer is disposed on the first electrode; and
   a second wetting layer disposed on the second electrode, wherein the insulating reflective layer has a second through hole or an upper surface of the second electrode, the second wetting layer is electrically connected to the second electrode through the second through hole of the insulating reflective layer, and an upper surface of the second wetting layer has recesses.

7. The light emitting device of claim 5, further comprising first electrode disposed on the first conductivity type semiconductor layer, wherein the insulating reflective layer comprises: a first insulating reflective layer disposed on the first electrode; and a second insulating reflective layer disposed on the second electrode, wherein the passivation layer is in contact with the first insulating reflective layer and the second insulating reflective layer.

8. The light emitting device of claim 1, wherein the end portion of the insulating reflective layer is spaced inward from an end of the upper surface of the light emitting structure.

9. A light emitting device package having a first package electrode and a second package electrode on a predetermined package body, in which a predetermined light emitting device is disposed,
   wherein the light emitting device comprises claim 1.

10. lighting apparatus comprising a light-emitting unit comprising the light emitting device according to claim 1.

11. A light emitting device comprising:
    a light emitting structure including a first conductivity type semiconductor layer, an active layer disposed on the first conductivity type semiconductor layer, and a second conductivity type semiconductor layer disposed on the active layer;
    a substrate disposed below the first conductivity type semiconductor layer;
    a plurality of third electrodes disposed on the first conductivity type semiconductor layer exposed by removing a portion of the second conductivity type semiconductor layer and the active layer;
    a plurality of fourth electrodes disposed on the second conductivity type semiconductor layer;
    a third insulating reflective layer disposed on a side surface and a part of an upper surface of the plurality of third electrodes to expose an upper surface of the plurality of third electrodes;
    a fourth insulating reflective layer disposed on a side surface and a part of an upper surface of the plurality of fourth electrodes so as to expose the upper surface of the plurality of fourth electrodes;
    a third wetting layer disposed on the third insulating reflective layer and the plurality of third electrodes; and
    a fourth wetting layer disposed on the fourth insulating reflective layer and the plurality of fourth electrodes,
    wherein an end of the fourth insulating reflective layer is spaced apart from an outer surface of the light emitting structure by a predetermined distance.

12. The light emitting device of claim 11, wherein a horizontal width of the fourth wetting layer is larger than a horizontal width of the fourth electrode.

13. The light emitting device of claim 12, wherein one end of the fourth insulating reflection layer is exposed to a side surface of the fourth wetting layer.

14. The light emitting device of claim 11, wherein the plurality of third electrodes are physically spaced from each other, and
    wherein the plurality of third electrodes are electrically connected to each other by the third wetting layer.

15. The light emitting device of claim 11, wherein the plurality of fourth electrodes are physically spaced from each other, and
    wherein the plurality of fourth electrodes are electrically connected to each other by the fourth wetting layer.

16. The light emitting device of claim 11, wherein a horizontal width of the fourth insulating reflection layer is larger than a horizontal width of the fourth wetting layer.

17. The light emitting device of claim 11, wherein a horizontal width of the third insulating reflective layer is, larger than a horizontal width of the third wetting layer.

18. The light emitting device of claim 11, further comprising a first reflective layer disposed below the plurality of third electrodes; and
a second reflective layer disposed below the plurality of fourth electrodes.

19. The light emitting device of claim 11, wherein an upper surface of the fourth wetting layer comprises a recess.

* * * * *